United States Patent
Sasaoka

(10) Patent No.: US 7,760,785 B2
(45) Date of Patent: Jul. 20, 2010

(54) GROUP-III NITRIDE SEMICONDUCTOR DEVICE

(75) Inventor: Chiaki Sasaoka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/991,544

(22) Filed: Nov. 19, 2004

(65) Prior Publication Data

US 2005/0072986 A1 Apr. 7, 2005

Related U.S. Application Data

(62) Division of application No. 10/231,163, filed on Aug. 30, 2002, now Pat. No. 6,841,410.

(30) Foreign Application Priority Data

Sep. 3, 2001 (JP) .............................. 2001-265854

(51) Int. Cl.
*H01S 5/343* (2006.01)
*H01L 33/14* (2010.01)

(52) U.S. Cl. .............. 372/46.013; 372/45.01; 372/46.01; 257/97; 257/103

(58) Field of Classification Search ............. 372/46.013
See application file for complete search history.

(56) References Cited

U.S. PATENT DOCUMENTS

| 4,927,471 | A | * | 5/1990 | Okuda ........................ 148/33.5 |
| 5,473,174 | A | * | 12/1995 | Ohsawa ....................... 257/190 |
| 5,982,006 | A | * | 11/1999 | Joyner ........................ 257/347 |
| 5,987,048 | A | * | 11/1999 | Ishikawa et al. ......... 372/46.01 |
| 6,028,339 | A | * | 2/2000 | Frenette et al. ............. 257/364 |
| 6,242,761 | B1 | * | 6/2001 | Fujimoto et al. .............. 257/94 |
| 6,468,347 | B1 | | 10/2002 | Motori et al. |
| 6,597,717 | B1 | * | 7/2003 | Kneissl et al. ........... 372/46.01 |
| 2001/0009167 | A1 | * | 7/2001 | Davis et al. ................... 148/33 |

FOREIGN PATENT DOCUMENTS

| JP | 07030185 A * | 1/1995 |
| JP | 8-97508 | 4/1996 |
| JP | 9-232680 | 9/1997 |
| JP | 09 246670 A * | 9/1997 |
| JP | 10-093192 | 4/1998 |
| JP | 11-121801 | 4/1999 |
| JP | 11-261160 | 9/1999 |
| JP | 2001-015860 | 1/2001 |
| JP | 2001-44567 | 2/2001 |

OTHER PUBLICATIONS

Amano et al, "Metalorganic vapor phase epitaxial growth of a high quality GaN film using an AlN buffer layer", Applied Physics Letters 48(5), 353-355 (Feb. 1986).*

Marchand et al, "Microstructure of GaN laterally overgrown by metalorganic chemical vapor deposition", Applied Physics Letters 73(6), 747-749 (Aug. 1998).*

(Continued)

*Primary Examiner*—Johannes P Mondt
(74) *Attorney, Agent, or Firm*—Young & Thompson

(57) ABSTRACT

A method of forming a partially etched nitride-based compound semiconductor crystal layer includes the following steps. A non-crystal layer of a nitride-based compound semiconductor is formed. At least a part of the non-crystal layer is then etched to form a partially etched non-crystal layer before the partially etched non-crystal layer is crystallized to form a partially etched nitride-based compound semiconductor crystal layer.

2 Claims, 5 Drawing Sheets

OTHER PUBLICATIONS

Kimura, Tatsuya, computerized translation from the Japan Patent Office website (Patent Abstracts of Japan, http://www19ipdl.inpit.go.jp, of Kimura, Tatsuya, "Semiconductor Laser Device and Its Manufacture" (JP 07030185 A).*

M. S. Minksy et al., "Room-temperature photoenhanced wet etching of GaN", Appl. Phys. Lett. 68 (11), Mar. 11, 1996, pp. 1531-1533.

M. Kuramoto et al., "Novel Ridge-type InGaN MQW Laser Diodes Fabricated by Selective Area re-growth on GaN Substrates", The Institute of Electronics, Information and Communication Engineers, Technical Report of IEICE, LQE2001-29 (Jun. 2001), pp. 73-78.

Y. Arakawa et al., "Physics and Simulation of Optoelectronic Devices IX", Proceedings of SPIE, vol. 4283, (2001), pp. 58-66.

* cited by examiner

GROUP-III NITRIDE SEMICONDUCTOR DEVICE

CROSS REFERENCE TO RELATED APPLICATIONS

This application is a division of co-pending application Ser. No. 10/231,163, filed on Aug. 30, 2002, the entire contents of which are hereby incorporated by reference.

BACKGROUND OF THE INVENTION

1. Field of the Invention

The present invention relates to a method for forming a Group-III nitride semiconductor layer and a Group-III nitride semiconductor device.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

Group-III nitride semiconductors have relatively large forbidden band gaps and allow a direct transition between conduction and valence bands, for which reason applications of the Group-III nitride semiconductors to short wavelength light emitting devices have been on the aggressive investigations. Also, the Group-III nitride semiconductors have relatively large saturated drift velocities of electron and also allow a hetero-junction structure to generate a two-dimension carrier gas. These desirable properties will be attractive for applications to various electron devices.

The Group-III nitride semiconductors are, however, not suitable in micro-processability or etching-controllability, while improvement or increase in micro-processability or etching-controllability of the Group-III nitride semiconductors are essential for realizing desirable high performances of the Group-III nitride semiconductor device. In this circumstances, the importance for improving the controllability of micro-process or micro-etching has been on the increase.

The above technical issues, which are required to be solved, will hereinafter be described in detail by taking some typical examples of optical devices such as semiconductor lasers.

One typical example of the Group-III nitride semiconductors is gallium nitride. The Group-III nitride semiconductors are attractive for a light emitting diode or a laser diode for emitting a blue color laser. The laser diode is attractive as a light source for a large capacitive optical disk. In recent years, aggressive development of high output laser diodes as write-purpose light source has been made. For application to the optical disk, a fine or highly-controlled bean spot is essential, wherein it is important to control a transverse-mode. For high output, it is important to increase an efficiency of carrier injection. Further, high frequency performances are also important as transfer speed of the optical disk is increased. In order to improve the high frequency performances, possible reductions in not only resistance but also parasitic capacitance of the device are important.

FIG. 1 is a fragmentary schematic cross sectional elevation view of a typical example of a conventional structure of a nitride semiconductor laser diode with a ridge-structure for current confinement. The conventional structure includes an n-GaN substrate 501, an n-AlGaN cladding layer 502 over the n-GaN substrate 501, an n-GaN guide layer 503 over the n-AlGaN cladding layer 502, an InGaN multiple quantum well structure 504 over the n-GaN guide layer 503, a p-GaN guide layer 505 over the InGaN multiple quantum well structure 504, and a p-AlGaN cladding layer 506 over the p-GaN guide layer 505. The p-AlGaN cladding layer 506 has a ridge structure 508 which may be formed by an isotropic etching. A p-GaN layer 507 is provided over a top of the ridge structure 508. An insulating layer 510 is provided on the p-AlGaN cladding layer 506, wherein the insulating layer 510 has a stripe-shaped opening over the p-GaN layer over the top of the ridge structure 508. A p-electrode 509 is provided, which extends on the p-GaN layer and the insulating layer 510. The ridge structure 508 causes a current confinement. The control of the transverse mode may be made by adjustments in width and height of the ridge structure 508. The ridge-structured laser diode is advantageous or superior in high frequency performance due to its low parasitic capacitance.

On the other hand, another type laser diode with buried-current-confinement layer was proposed as realizing a higher current confinement efficiency than the above ridge-structured laser diode. Japanese laid-open patent publication No. 10-093192 discloses the buried-structure laser diode. FIG. 2 is a fragmentary schematic cross sectional elevation view of a typical example of a conventional structure of a nitride semiconductor laser diode with a buried current confinement structure.

The other conventional device includes an n-GaN substrate 401, an n-AlGaN cladding layer 402 over the n-GaN substrate 401, an n-GaN guide layer 403 over the n-AlGaN cladding layer 402, an active layer 404 over the n-GaN guide layer 403, a p-GaN guide layer 405 over the active layer 404, and a p-AlGaN cladding layer 406 over the p-GaN guide layer 405. Further, a buried current confinement layer 407 with a stripe-shaped opening is provided over the p-AlGaN cladding layer 406. The buried current confinement layer 407 may comprise GaN or AlN. A part of a top surface of the p-AlGaN cladding layer 406 is exposed through the stripe-shaped opening of the buried current confinement layer 407. A p-GaN contact layer 408 is provided over the buried current confinement layer 407 and within the stripe-shaped opening. A p-electrode 409 is provided on the p-GaN contact layer 408. A carrier injection is made through the stripe-shaped opening with a current confinement by the buried current confinement layer 407. The buried current confinement layer 407 improves a carrier injection efficiency.

Japanese laid-open patent publication No. 2001-15860 discloses still another conventional structure comprising an AlN buried current confinement layer with an stripe-shaped opening for current confinement and transverse mode control, wherein the AlN buried current confinement layer is provided either in a cladding layer or between the cladding layer and a light emitting layer.

The above two conventional techniques utilize the buried current confinement layer with the opening allowing the carrier injection with current confinement. The transverse mode depends upon respective thicknesses of the layers, which are controllable in growth processes. For these reasons, the laser diode with the buried current confinement layer with the opening would be more advantageous in reproductively and yield than the above-described ridge-structured laser diode.

The above ridge-structure shown in FIG. 1 may be formed by a lithography technique and a subsequent isotropic etching technique. It should be noted that a chemical etching to the nitride semiconductors is not available due to property of the nitride semiconductors, while a halogen-based dry etching to the nitride semiconductors is available. The transverse mode characteristic of the ridge structure depends upon p-electrode stripe width, ridge with and ridge depth as main parameters.

The controllability or accuracy in the p-electrode stripe width and the ridge width depends on the accuracy of the lithography technique. On the other hand, the controllability or accuracy in the ridge depth depends on the etching-controllability which further depends on various parameters, for example, plasma conditions, etching gas flow rate, and substrate temperature in etching process. For those reasons, it is difficult to realize a high yield of the devices over a large area. Further, charge particles generated in the etching process may provide a damage to the active layer of the device.

With respect to the laser diode including the buried current confinement layer with the opening as shown in FIG. 2, if the current confinement layer comprises an n-GaN layer or an n-AlGaN layer, then a p-n junction is formed between the n-type current confinement layer and the p-type cladding layer or the p-type contact layer. This p-n junction causes a junction capacitance which may further cause a deterioration in high frequency performance. In order to avoid this problem, it is effective that the buried current confinement layer comprises an undoped nitride semiconductor, for example, undoped GaN or undoped AlGaN. The undoped nitride semiconductor is, however, higher in resistivity than the doped nitride semiconductor. Further, the undoped AlGaN or the undoped GaN grown over the n-type nitride semiconductor layer is likely to have an n-type conductivity. This means a difficulty of the crystal growth process for growing the undoped nitride semiconductor layer over the n-doped nitride semiconductor layer.

It should also be noted that the use of a single crystal AlN to the current confinement layer may improve the high frequency performance, but does provide the following problems or issues.

The first issue is concerned with a possible formation of crack which may be formed by differences in both lattice constant and thermal expansion coefficient between AlN and other nitride semiconductors such as AlGaN, GaN and InGaN. The other nitride semiconductors such as AlGaN, GaN and InGaN may be used for the cladding layers, the optical guide layers and the contact layer in the laser diode. In connection with the formation of the laser diode structure shown in FIG. 2, an undesired crack or cracks may be formed in three types processes. The first type process is an AlN deposition. The second type process is the deposition of GaN, AlGaN or InGaN over AlN. The third type process is substrate temperature rising or dropping.

The crack in connection with the first or second type process is due to the difference in lattice constant, and thus may be caused when a thickness of the AlN layer over the GaN, AlGaN or InGaN layer exceeds a critical thickness depending on the difference in lattice constant or when a thickness of the GaN, AlGaN or InGaN layer over the AlN layer also exceeds the critical thickness. In contrast, the crack in connection with the third type process is caused by variation or change in lattice constant due to a difference in thermal expansion coefficient between AlN and either GaN, AlGaN or InGaN. Even if no crack is caused in the AlN layer, it is highly possible that a crack or clacks may be caused in a top cladding layer over the crack-free AlN layer in the above second or third type process. Accordingly, it is difficult to suppress cracks completely. The crack in the AlN layer not only does render the current confinement layer dysfunctional in current confinement but also does cause the laser diode chip to be broken.

The second issue with the AlN current confinement layer is concerned with a difficulty in selective removal of the AlN current confinement layer. The above-described structures of FIGS. 1 and 2 need a selective removal of the AlN current confinement layer and a re-growth process for the p-type contact layer and the p-type cladding layer. A chlorine-based dry etching process is generally used for etching the nitride materials. It is difficult to realize a desired selective etching of AlN and either GaN, AlGaN or GaN by utilizing the chlorine-based dry etching process because of physical sputtering effect in the dry etching process. It is also difficult for the chlorine-based dry etching process to suppress undesired variation in etching depth of the nitride material due to variation in etching conditions. Namely, it is difficult for the chlorine-based dry etching process to realize a desired high etching-controllability of the nitride material. Therefore, the chlorine-based dry etching process has a difficulty to achieve a desired high yield and is likely to cause a problem with an etching-damage.

Japanese laid-open patent publication No. 9-232680 discloses a selective etching of AlN with an alkali solution such as KOH.

It is also disclosed by M. S. Minsky in Applied Physics Letter 68 (1996) 1531-1533 that these alkali etchants etch not only AlN but also GaN with an imperfect etching-selectivity and further cause an undesired deterioration in after-etching-morphology of the etched portion. The deterioration in the morphology causes a deterioration in crystal quality or crystal imperfection of re-grown layer. This is the significant problem.

Japanese laid-open patent publication No. 2001-15860 discloses that a stripe-shaped mask of $SiO_2$, which may be etched, is formed for subsequent deposition of AlN layer prior to a selective removal of the deposited AlN layer by a left-off method. As far as this method is concerned, the coverage of side walls of the mask by the AlN layer makes it difficult to carry out the intended left-off method. In order to avoid this problem, it is necessary to limit the thickness of the AlN layer so that the side walls of the mask are not covered by the deposited AlN layer. The limitation in the thickness of the deposited AlN layer provides a limitation to the desired increase in the withstand voltage of the device, and also allows an undesired increase in the leakage of current, resulting in an insufficient current confinement.

A further problem is that residual impurities of the lift-off mask may cause a deterioration in the device. Particularly if the mask material is silicon oxide, for example, $SiO_2$ or $SiO_x$, then it is difficult to completely remove residual Si, for which reason it is likely that a pile-up of Si is formed over a re-growth interface of the cladding layer. The pile-up of Si may cause a deterioration of electric characteristics of the device.

The above-described technical issues caused by the difficulty in processing or etching the Group-III nitride semiconductor layer would also be applicable to not only the laser diode but also any other electron devices utilizing the Group-III nitride semiconductor layer.

At present, a typical structure of the field effect transistor including GaN-based compound semiconductors is the planar type. Notwithstanding, in order to realize such a high level performance as required, it would be essential make not only an optimization of the materials for the multi-layer structure but also a structural modification of the nitride semiconductor layer such as a recess by subjecting the nitride semiconductor layer to an etching process.

In the above circumstances, the development of a novel technique for realizing a high processability or a high etching-controllability to the Group-III nitride compound semiconductor layer free from the above problems is desirable.

SUMMARY OF THE INVENTION

Accordingly, it is an object of the present invention to provide a novel method of forming a Group-III nitride compound semiconductor layer free from the above problems.

It is a further object of the present invention to provide a novel method of forming a Group-III nitride compound semiconductor layer with a high processability or a high etching-controllability.

It is a still further object of the present invention to provide a novel device structure including a Group-III nitride compound semiconductor layer free from the above problems.

It is yet a further object of the present invention to provide a novel device structure including a Group-III nitride compound semiconductor layer which is processed or etched at high accuracy.

It is further more object of the present invention to provide a novel method of forming a semiconductor device including a Group-III nitride compound semiconductor layer which is processed or etched at high accuracy free from the above problems.

It is moreover object of the present invention to provide a novel method of forming a semiconductor laser device including a Group-III nitride compound semiconductor layer which is processed or etched at high accuracy, so that the laser device is remarkably superior in carrier injection efficiency.

It is still more object of the present invention to provide a novel method of forming a semiconductor laser device including a Group-III nitride compound semiconductor layer which is processed or etched at high accuracy, so that the laser device is remarkably superior in transverse-mode controllability.

It is yet more object of the present invention to provide a novel method of forming a semiconductor laser device including a Group-III nitride compound semiconductor layer which is processed or etched at high accuracy, so that the laser device is remarkably superior in productivity.

It is another object of the present invention to provide a novel semiconductor device including a Group-III nitride compound semiconductor layer which is processed or etched at high accuracy free from the above problems.

It is further another object of the present invention to provide a novel semiconductor laser device including a Group-III nitride compound semiconductor layer which is processed or etched at high accuracy, so that the laser device is remarkably superior in carrier injection efficiency.

It is still another object of the present invention to provide a novel semiconductor laser device including a Group-III nitride compound semiconductor layer which is processed or etched at high accuracy, so that the laser device is remarkably superior in transverse-mode controllability.

It is yet another object of the present invention to provide a novel semiconductor laser device including a Group-III nitride compound semiconductor layer which is processed or etched at high accuracy, so that the laser device is remarkably superior in productivity.

It is an additional object of the present invention to provide a novel method of forming a field effect transistor including a Group-III nitride compound semiconductor layer which is processed or etched at high accuracy, so that the field effect transistor is reduced in contact resistance with an electrode or electrodes such as source/drain electrodes.

It is a further additional object of the present invention to provide a novel method of forming a field effect transistor including a Group-III nitride compound semiconductor layer which is processed or etched at high accuracy, so that the field effect transistor is superior in withstand voltage characteristic.

It is yet an additional object of the present invention to provide a novel field effect transistor including a Group-III nitride compound semiconductor layer which is processed or etched at high accuracy, so that the field effect transistor is reduced in contact resistance with an electrode or electrodes such as source/drain electrodes.

It is a further more additional object of the present invention to provide a novel field effect transistor including a Group-III nitride compound semiconductor layer which is processed or etched at high accuracy, so that the field effect transistor is superior in withstand voltage characteristic.

The present invention provides a method of forming a partially etched nitride-based compound semiconductor crystal layer includes the following steps. A non-crystal layer of a nitride-based compound semiconductor is formed. At least a part of the non-crystal layer is then etched to form a partially etched non-crystal layer before the partially etched non-crystal layer is crystallized to form a partially etched nitride-based compound semiconductor crystal layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
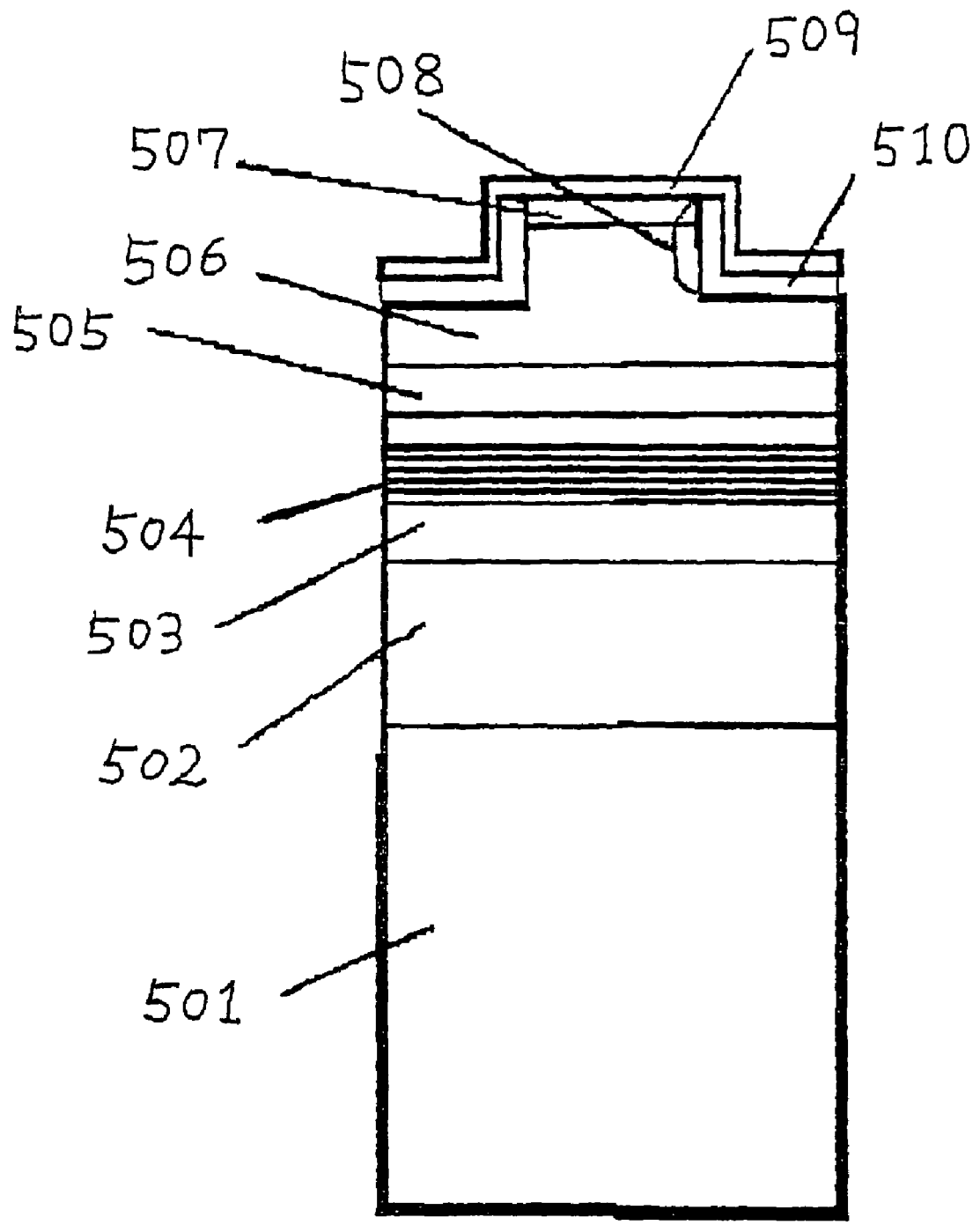
FIG. 1 is a fragmentary schematic cross sectional elevation view of a typical example of a conventional structure of a nitride semiconductor laser diode with a ridge-structure for current confinement.
Figure 2:
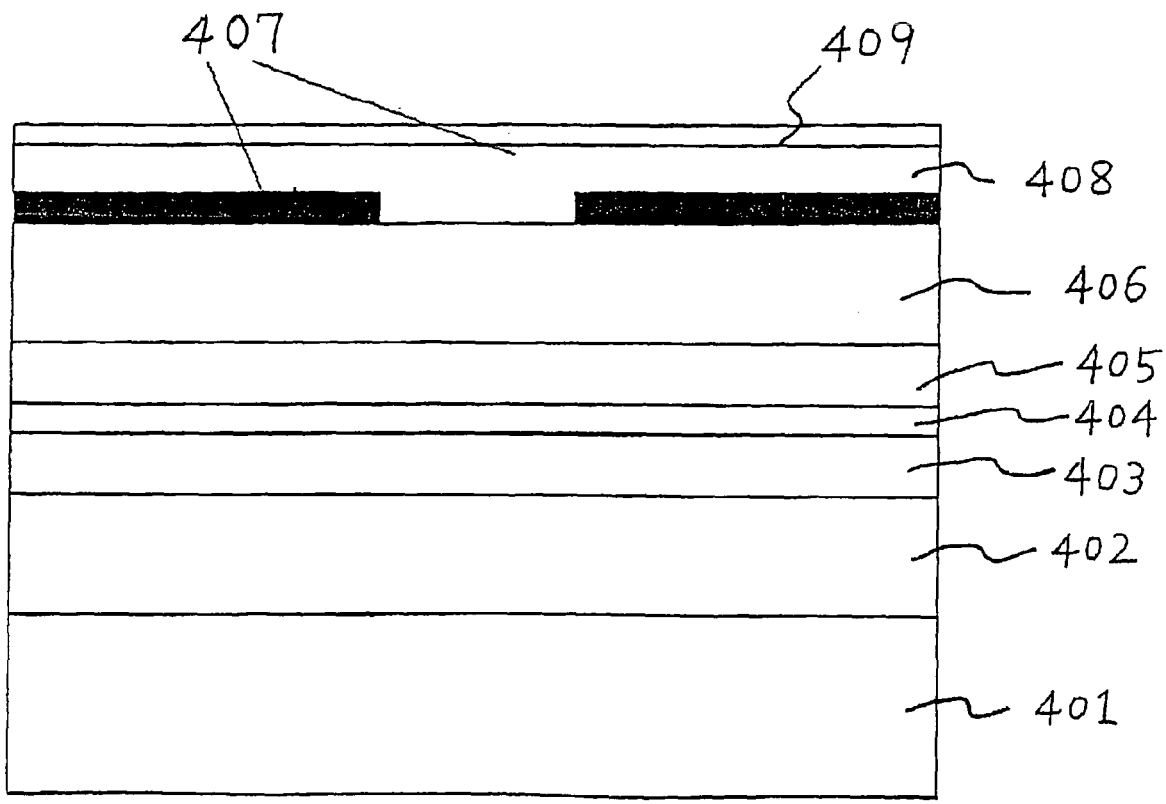
FIG. 2 is a fragmentary schematic cross sectional elevation view of a typical example of a conventional structure of a nitride semiconductor laser diode with a buried current confinement structure.

In a first primary aspect of the present invention, a method of forming a partially etched nitride-based compound semiconductor crystal layer includes the following steps. A non-crystal layer of a nitride-based compound semiconductor is formed. At least a part of the non-crystal layer is then etched to form a partially etched non-crystal layer before the partially etched non-crystal layer is crystallized to form a partially etched nitride-based compound semiconductor crystal layer. The partially etched nitride-based compound semiconductor crystal layer comprises at least one of a single crystal structure and a polycrystal structure. The non-crystal layer comprises an amorphous structure or a locally micro-crystallized amorphous structure. Namely, in the present specification, the term "non-crystal" means the amorphous state or a locally micro-crystallized amorphous state which includes a majority of amorphous state and a minority of micro-crystallized state, while the term "crystal state" means either the single crystal state or the polycrystal state. Further, in the present specification, for simple expression, the term "amorphous state" includes the "locally micro-crystallized amorphous state" or substantially means the "non-crystal state" unless a specific notice to the country is given.

The present invention is applicable to all of the nitride compound semiconductors. A typical example of the nitride compound semiconductors may include a variety of Group-III nitride compound semiconductors which may be represented by $In_xGa_yAl_{1-x-y}N$ ($0 \leq x \leq 1$, $0 \leq y \leq 1$, $0 \leq x+y \leq 1$), for example, AlN, GaN, InGaN, AlGaN, and InAlGaN.

The crystallization of the partially etched non-crystal layer may be caused by supplying a thermal energy to the partially etched non-crystal layer. For example, a heat treatment to the partially etched non-crystal layer may be available. Alternatively, it may be available that an additional compound semiconductor crystal layer may be formed over the partially etched non-crystal layer at a high temperature which causes the partially etched non-crystal layer to be crystallized. In this case, it is unnecessary to carry out the additional step of the heat treatment for the purpose of only the crystallization.

It was found out by the present inventor that an etching rate in the amorphous state or the locally micro-crystallized amorphous state of the nitride-based compound semiconductor is distinctly higher than that in the crystal state thereof. There exists a distinctive difference in etching rate between the crystal state and the non-crystal state which includes the amorphous state and the locally micro-crystallized amorphous state. The high etching rate provided by the non-crystal state means that the etching-controllability in the non-crystal state is higher than that in the crystal state. Namely, the nitride-based compound semiconductor crystal is higher or more superior in etching-controllability or micro-processability than the nitride-based compound semiconductor non-crystal. The present invention utilizes the higher etching-controllability or micro-processability provided by the non-crystal state including the amorphous state and the locally micro-crystallized amorphous state. In this viewpoint, the nitride-based compound semiconductor layer is originally formed in the non-crystal state for subsequent highly accurate etching process in the non-crystal state with the higher etching-controllability or micro-processability before the partially etched nitride-based compound semiconductor non-crystal is then crystallized to obtain the accurately and finely processed or etched nitride-based compound semiconductor crystal. Typically, the highly accurate etching process in the non-crystal state with the higher etching-controllability or micro-processability may form one or more openings which are finely and accurately defined in size and shape.

The etching process may typically be carried out by an isotropic etching such as a wet etching by use of any available etchant. One typical example of the available etchants may be a phosphate-containing etchant. In view of the possible high etching-controllability, the phosphate-containing hot etchant with a temperature in the range of 50-200° C. is preferable. And more preferably, the temperature is in the range of 80-120° C. In this case, a typical example of the nitride-based compound semiconductor may include amorphous AlN. Notwithstanding, a nitrate-containing hot etchant with a temperature of at least 80° C. is also available. The use of the phosphate-containing hot etchant may obtain an etching rate of 1-30 nm/min. of the amorphous AlN.

The non-crystal state including the amorphous state is free of any substantive etching-rate-dependency upon the crystal orientation or the crystal plane, while the crystal state has the etching-rate-dependency. For this reason, the non-crystal state including the amorphous state allows an isotropic etching to the nitride-based compound semiconductor non-crystal.

The non-crystal layer of a first nitride-based compound semiconductor is grown on a crystal base layer of a second compound semiconductor different in lattice-constant from the first nitride-based compound semiconductor. Thus, the non-crystal state or the amorphous state may avoid that any crack is caused due to the difference in lattice-constant. The subsequent crystallization of the nitride-based compound semiconductor non-crystal on the crystal base layer is caused in solid-phase with keeping the crystal orientation or the crystal plane of the crystal base layer. In the crystallization process, a relatively high density of dislocations is introduced into the nitride-based compound semiconductor layer placed in the crystallization. This introduction of the relatively high density of dislocations so relaxes the difference in lattice-constant as to cause substantively no crack in the nitride-based compound semiconductor layer. The relatively high density of dislocations of the crack-free nitride-based compound semiconductor crystal layer also allows a further crack-free growth of an additional compound semiconductor layer on the crack-free nitride-based compound semiconductor crystal layer because of further propagation of the relatively high density of dislocations from the crack-free nitride-based compound semiconductor crystal layer into the additional compound semiconductor layer, and the relatively high density of propagated dislocations in the additional compound semiconductor layer also relaxes the difference in lattice-constant between the nitride-based compound semiconductor crystal layer and the additional compound semiconductor layer. The dislocations may typically be edge dislocations caused by a low angle grain boundary of the nitride-based compound semiconductor crystal layer. The propagation of the edge dislocations is directed vertical to the plane of the growth surface. As described above, the nitride-based compound semiconductor crystal layer has one or more etched-parts, for example, one or more the openings. In the opening, no edge dislocation is present. For this reason, the additional compound semiconductor layer within and over the opening has the dislocation-free crystal perfection, while the additional compound semiconductor layer over the dislocation-introduced nitride-based compound semiconductor crystal layer has also the dislocation-introduced crystal imperfection.

Consequently, the growth in the non-crystal state or the amorphous state of the nitride-based compound semiconductor on the crystal state base layer is advantageous in view of preventing or suppressing any formation of crack in connection with the difference in lattice-constant.

In one typical example, the partially etched nitride-based compound semiconductor crystal layer may have a dislocation density of at least $1E10\ cm^{-2}$. In another typical example, both the partially etched nitride-based compound semiconductor crystal layer and the additional compound semiconductor crystal layer over the partially etched nitride-based compound semiconductor crystal layer may have a dislocation density of at least $1E10\ cm^{-2}$.

As described above, the present invention utilizes the distinctive difference in etching rate between the crystal state and the non-crystal state. It is advantageous that the nitride-based compound semiconductor non-crystal layer is formed on a crystal base layer, so that the subsequent etching process for forming one or more the openings may be carried out by using the crystal base layer as an etching stopper by utilizing the fact that the etching rate of the crystal state is lower than that of the non-crystal state or the amorphous state. In one typical example, the crystal base layer may comprise a GaN layer, and the nitride-based compound semiconductor layer may comprise a Group-III nitride compound semiconductor represented by $Al_\alpha Ga_{1-\alpha}N$ ($0 \leq \alpha \leq 1$). In another typical example, the crystal base layer may comprise a Group-III nitride compound semiconductor represented by $Al_\beta Ga_{1-\beta}N$ ($0 \leq \beta \leq 1$), and the nitride-based compound semiconductor layer may comprise a GaN layer.

The non-crystal growth of the nitride-based compound semiconductor layer may be made at a low temperature typically in the range of 200-700° C., and more preferably in the range of 200-500° C. The above crystallization after the etching process may be made at a high temperature typically in the range of 700-1300° C., and more preferably in the range of 900-1300° C.

Further, it is advantageous but optional to introduce oxygen atoms into the nitride-based compound semiconductor non-crystal layer before the crystallization process thereof. In one typical example, it is available to oxidize a surface of the non-crystal layer. An introduction of oxygen into at least an upper surface region of the nitride-based compound semiconductor amorphous layer is available. In another typical example, it is available to have an oxide layer present on the partially etched non-crystal layer at latest before the partially etched non-crystal layer is crystallized, so that the oxide layer on the partially etched non-crystal layer suppresses a mass-transport of at least one kind of atom of the nitride-based compound semiconductor. In one preferable example, the oxide layer may advantageously comprise an oxide mask to be used in the etching process for etching the non-crystal layer, prior to the step of crystallization of the partially etched non-crystal layer with having the oxide mask remain, so that the oxide mask suppresses a mass-transport of at least one kind of atom of the nitride-based compound semiconductor.

The intentional introduction of oxygen may provide the following two advantageous effects. The first advantageous effect is to realize a desired highly planer surface morphology. As described above, the nitride-based amorphous layer is partially etched, prior to the crystallization of the partially etched nitride-based amorphous layer. The presence of oxygen atoms over the surface region or in the upper region of the partially etched nitride-based amorphous layer contributes to suppress an undesired mass-transport of one or more kinds of atoms of the partially etched nitride-based amorphous layer. The suppression to the undesired mass-transport prevents non-flatness of the surface of the crystallized nitride-based compound semiconductor layer. Namely, the suppression to the undesired mass-transport realizes an island-free planarized surface of the crystallized nitride-based compound semiconductor layer. The desired island-free planarized surface of the crystallized nitride-based compound semiconductor layer may be transferred to the surface of the additional crystal layer over the crystallized nitride-based compound semiconductor layer, whereby a desired highly planarized surface morphology may be obtained.

The absence of oxygen atoms over the surface region or in the upper region of the partially etched nitride-based amorphous layer may allow an undesired mass-transport of one or more kinds of atoms of the partially etched nitride-based amorphous layer. The allowance of the undesired mass-transport may cause non-flatness of the surface of the crystallized nitride-based compound semiconductor layer. Namely, the allowance of the undesired mass-transport may result in an undesired island-like non-planarized surface of the crystallized nitride-based compound semiconductor layer. The undesired island-like non-planarized surface of the crystallized nitride-based compound semiconductor layer may be transferred to the surface of the additional crystal layer over the crystallized nitride-based compound semiconductor layer, whereby any undesired non-planarized surface morphology may be obtained.

The second advantageous effect is to realize a reduction in leakage of current. As described above, the crystallized nitride-based compound semiconductor layer has a relatively high density of dislocations such as edge dislocations upon the crystallization process. The relatively high density of dislocations allows leak current to flow along the dislocations. However, oxygen atoms present over the surface region or in the upper region of the partially etched nitride-based amorphous layer are likely to be selectively localized to the dislocations in the crystallization process, whereby the dislocations become electrically inactive which reduces the leakage of current along the dislocations. This makes the nitride-based compound semiconductor crystal layer suitable as current confinement layer.

In a typical example, the oxygen-introduced region of the partially etched nitride-based compound semiconductor crystal layer may have an oxygen concentration of at least $1E18\ cm^{-3}$.

In one typical example, the partially etched nitride-based compound semiconductor crystal layer with the opening may be applicable to a current confinement layer in a laser diode. Namely, the first aspect of the present invention may advantageously be applicable to the formations of any electron devices having a current confinement layer, for example, laser diodes.

In another typical example, the partially etched nitride-based compound semiconductor crystal layer with the opening may be applicable to electrode contact layers, for example, source/drain contact layers, on which source and drain electrodes are provided in a field effect transistor. Namely, the first aspect of the present invention may advantageously be applicable to the formations of any field effect transistors.

The above described present invention may be applicable to a variety of electron devices which include a nitride-based compound semiconductor crystal layer which is partially etched or which has one or more openings.

A second primary aspect of the present invention is a method of forming a nitride-based compound semiconductor multi-layer structure. The method includes the following steps. A non-crystal layer of a nitride-based compound semiconductor is formed on a base layer. An introduction of oxygen atoms either into at least an upper region of the non-crystal layer or over the non-crystal layer is made. The non-crystal layer is selectively etched to form at least an opening, thereby to form a partially etched non-crystal layer. The partially etched non-crystal layer is then crystallized for forming a partially etched nitride-based compound semiconductor crystal layer, as well as for allowing the introduced oxygen atoms to suppress a mass-transport of at least one kind of atom of the nitride-based compound semiconductor.

As described above in connection with the first primary aspect of the present invention, an etching rate in the amorphous state or the locally micro-crystallized amorphous state of the nitride-based compound semiconductor is distinctly higher than that in the crystal state thereof. There exists a distinctive difference in etching rate between the crystal state and the non-crystal state which includes the amorphous state and the locally micro-crystallized amorphous state. The high etching rate provided by the non-crystal state means that the etching-controllability in the non-crystal state is higher than that in the crystal state. Namely, the nitride-based compound semiconductor crystal is higher or more superior in etching-controllability or micro-processability than the nitride-based compound semiconductor non-crystal. The present invention utilizes the higher etching-controllability or micro-processability provided by the non-crystal state including the amorphous state and the locally micro-crystallized amorphous state. In this viewpoint, the nitride-based compound semiconductor layer is originally formed in the non-crystal state for subsequent highly accurate etching process in the non-crystal state with the higher etching-controllability or micro-processability before the partially etched nitride-based compound semiconductor non-crystal is then crystallized to obtain the accurately and finely processed or etched nitride-based compound semiconductor crystal. Typically, the highly accurate etching process in the non-crystal state with the higher etching-controllability or micro-processability may form one or more openings which are finely and accurately defined in size and shape.

The further detailed descriptions made in connection with the above first aspect of the present invention would also be applicable to this second aspect of the present invention. The following descriptions in connection with this second aspect of the present invention will be made to focus on the constitutional subject matters without relevant detailed technical descriptions for avoiding duplications and redundancy.

The step of crystallizing the partially etched non-crystal layer may advantageously comprise a step of forming an additional compound semiconductor crystal layer over the partially etched non-crystal layer at a temperature which causes the partially etched non-crystal layer to be crystallized.

The step of etching at least a part of the non-crystal layer may advantageously comprise a step of carrying out an isotropic etching. This isotropic etching may be carried out by use of any available etchant. One typical example of the available etchants may be a phosphate-containing hot etchant.

The nitride-based compound semiconductor may advantageously comprise a Group-III nitride compound semiconductor represented by $In_xGa_yAl_{1-x-y}N$ ($0 \leq x \leq 1$, $0 \leq y \leq 1$, $0 \leq x+y \leq 1$).

The non-crystal layer may advantageously be formed on a crystal base layer which serves as an etching stopper in the etching process. As described above, the etching rate of the non-crystal layer or the amorphous layer is distinctively higher than the crystal layer, for which reason the crystal base layer may serve as an etching stopper layer in the etching process for selectively or partially etching the non-crystal layer.

In one typical example, the crystal base layer may advantageously comprise a GaN layer, and the nitride-based compound semiconductor non-crystal layer may advantageously comprise a Group-III nitride compound semiconductor represented by $Al_\alpha Ga_{1-\alpha}N$ ($0 \leq \alpha \leq 1$).

In another typical example, the crystal base layer may advantageously comprise a Group-III nitride compound semiconductor represented by $Al_\beta Ga_{1-\beta}N$ ($0 \leq \beta \leq 1$), and the nitride-based compound semiconductor may advantageously comprise a GaN layer.

In one typical example, the non-crystal layer may be formed at a temperature in the range of 200-700° C., and more preferably in the range of 200-500° C.

In one typical example, the step of crystallizing the partially etched non-crystal layer may be carried out at a temperature in the range of 700-1300° C., and more preferably in the range of 900-1300° C.

In one typical example, the partially etched nitride-based compound semiconductor crystal layer may advantageously serve as a current confinement layer. Namely, the second aspect of the present invention may advantageously be applicable to the formations of any electron devices having a current confinement layer, for example, laser diodes.

In another typical example, the partially etched nitride-based compound semiconductor crystal layer may advantageously serve as electrode contact layers, for example, source/drain contact layers, on which source and drain electrodes are provided in a field effect transistor. Namely, the second aspect of the present invention may advantageously be applicable to the formations of any field effect transistors.

An oxygen-introduced region of the partially etched nitride-based compound semiconductor crystal layer may advantageously have an oxygen concentration of at least $1E18$ cm$^{-3}$.

The partially etched nitride-based compound semiconductor crystal layer may advantageously have a dislocation density of at least $1E10$ cm$^{-2}$.

The partially etched nitride-based compound semiconductor crystal layer and the additional compound semiconductor crystal layer over the partially etched nitride-based compound semiconductor crystal layer may advantageously have a dislocation density of at least $1E10$ cm$^{-2}$.

A third aspect of the present invention is a method of forming a partially etched nitride-based compound semiconductor crystal layer. The method includes the following steps. A non-crystal layer of a nitride-based compound semiconductor is formed at such a first temperature that the non-crystal layer comprises an amorphous structure or a locally micro-crystallized amorphous structure. At least a part of the non-crystal layer is etched to form a partially etched non-crystal layer. An additional compound semiconductor crystal layer is then formed over the partially etched non-crystal layer at a second temperature higher than the first temperature, wherein the second temperature causes the partially etched non-crystal layer to be crystallized, to form a partially etched nitride-based compound semiconductor crystal layer, which comprises at least one of a single crystal structure and a polycrystal structure.

As described above in connection with the first primary aspect of the present invention, an etching rate in the amorphous state or the locally micro-crystallized amorphous state of the nitride-based compound semiconductor is distinctly higher than that in the crystal state thereof. There exists a distinctive difference in etching rate between the crystal state and the non-crystal state which includes the amorphous state and the locally micro-crystallized amorphous state. The high etching rate provided by the non-crystal state means that the etching-controllability in the non-crystal state is higher than that in the crystal state. Namely, the nitride-based compound semiconductor crystal is higher or more superior in etching-controllability or micro-processability than the nitride-based compound semiconductor non-crystal. The present invention utilizes the higher etching-controllability or micro-processability provided by the non-crystal state including the amorphous state and the locally micro-crystallized amorphous state. In this viewpoint, the nitride-based compound semiconductor layer is originally formed in the non-crystal state for subsequent highly accurate etching process in the non-crystal state with the higher etching-controllability or micro-processability before the partially etched nitride-based compound semiconductor non-crystal is then crystallized to obtain the accurately and finely processed or etched nitride-based compound semiconductor crystal. Typically, the highly accurate etching process in the non-crystal state with the higher etching-controllability or micro-processability may form one or more openings which are finely and accurately defined in size and shape.

The further detailed descriptions made in connection with the above first aspect of the present invention would also be applicable to this third aspect of the present invention. The following descriptions in connection with this third aspect of the present invention will be made to focus on the constitutional subject matters without relevant detailed technical descriptions for avoiding duplications and redundancy.

In one typical example, the step of etching at least a part of the non-crystal layer may advantageously comprise a step of carrying out an isotropic etching by use of a phosphate-containing etchant.

In one typical example, the nitride-based compound semiconductor may advantageously comprise a Group-III nitride compound semiconductor represented by $In_xGa_yAl_{1-x-y}N$ ($0 \leq x \leq 1$, $0 \leq y \leq 1$, $0 \leq x+y \leq 1$).

In one typical example, the non-crystal layer may advantageously be formed on a crystal base layer which serves as an etching stopper in the etching process for partially and selectively etching the non-crystal layer. As described above, the etching rate of the non-crystal layer or the amorphous layer is distinctively higher than the crystal layer, for which reason the crystal base layer may serve as an etching stopper layer in the etching process for selectively or partially etching the non-crystal layer.

In one typical example, the crystal base layer may advantageously comprise a GaN layer, and the nitride-based compound semiconductor may advantageously comprise a Group-III nitride compound semiconductor represented by $Al_\alpha Ga_{1-\alpha}N$ ($0 \leq \alpha \leq 1$).

In another typical example, the crystal base layer may advantageously comprise a Group-III nitride compound semiconductor represented by $Al_\beta Ga_{1-\beta}N$ ($0 \leq \beta \leq 1$), and the nitride-based compound semiconductor may advantageously comprise a GaN layer.

The above first temperature may typically be in the range of 200-700° C., and more preferably in the range of 200-500° C. The above second temperature may be in the range of 700-1300° C., and more preferably in the range of 900-1300° C.

In one preferable example, it may be advantageous but optional to further include a step of oxidizing a surface of the non-crystal layer before the step of crystallizing the partially etched non-crystal layer. The advantageous effects of the presence of oxygen over or in the partially etched non-crystal layer are as described above in connection with the first primary aspect of the present invention.

In another preferable example, it may be advantageous but optional to further include a step of introducing oxygen into at least an upper surface region of the nitride-based compound semiconductor amorphous layer. The advantageous effects of the presence of oxygen over or in the partially etched non-crystal layer are also as described above in connection with the first primary aspect of the present invention. In this case, an oxygen-introduced region of the partially etched nitride-based compound semiconductor crystal layer may preferably have an oxygen concentration of at least $1E18$ $cm^{-3}$.

In still another preferable example, it may be advantageous but optional to further include a step of presenting an oxide layer on the partially etched non-crystal layer until the partially etched non-crystal layer is crystallized, so that the oxide layer suppresses a mass-transport of at least one kind of atom of the nitride-based compound semiconductor. In this case, the step of presenting the oxide layer may advantageously and optionally comprise a step of forming an oxide mask before the step of etching by use of the oxide mask, prior to the step of crystallizing with having the oxide mask remain.

In a preferred example, the partially etched nitride-based compound semiconductor crystal layer may advantageously and optionally have a dislocation density of at least $1E10$ $cm^{-2}$.

In a preferred example, the partially etched nitride-based compound semiconductor crystal layer and the additional compound semiconductor crystal layer over the partially etched nitride-based compound semiconductor crystal layer may advantageously and optionally have a dislocation density of at least $1E10$ $cm^{-2}$.

In one typical example, the partially etched nitride-based compound semiconductor crystal layer may advantageously serve as a current confinement layer. Namely, the second aspect of the present invention may advantageously be applicable to the formations of any electron devices having a current confinement layer, for example, laser diodes.

In another typical example, the partially etched nitride-based compound semiconductor crystal layer may advantageously serve as electrode contact layers, for example, source/drain contact layers, on which source and drain electrodes are provided in a field effect transistor. Namely, the second aspect of the present invention may advantageously be applicable to the formations of any field effect transistors.

In a fourth aspect of the present invention, a semiconductor multilayer structure includes: a first Group-III nitride compound semiconductor layer; a second Group-III nitride compound semiconductor layer over the first Group-III nitride compound semiconductor layer, and the second Group-III nitride compound semiconductor layer having at least one opening; and a third Group-III nitride compound semiconductor layer within the at least one opening and over the second Group-III nitride compound semiconductor layer, wherein the at least one opening has an etched wall shaped by an isotropic etching free of any substantive etching-rate-dependency upon orientation.

It is preferable that the second Group-III nitride compound semiconductor layer comprises $Al_\alpha Ga_{1-\alpha}N$ ($0 \leq \alpha \leq 1$).

It is preferable that the second Group-III nitride compound semiconductor layer includes an oxygen-introduced region with an oxygen concentration of at least $1E18$ $cm^{-3}$.

It is also preferable that the second Group-III nitride compound semiconductor layer has a dislocation density of at least $1E10$ $cm^{-2}$.

It is also preferable that the second Group-III nitride compound semiconductor layer and the third Group-III nitride compound semiconductor layer have a dislocation density of at least $1E10$ $cm^{-2}$.

It is also preferable that the second Group-III nitride compound semiconductor layer serves as a top cladding layer, and the second Group-III nitride compound semiconductor layer serves as a current confinement layer.

Figure 3:
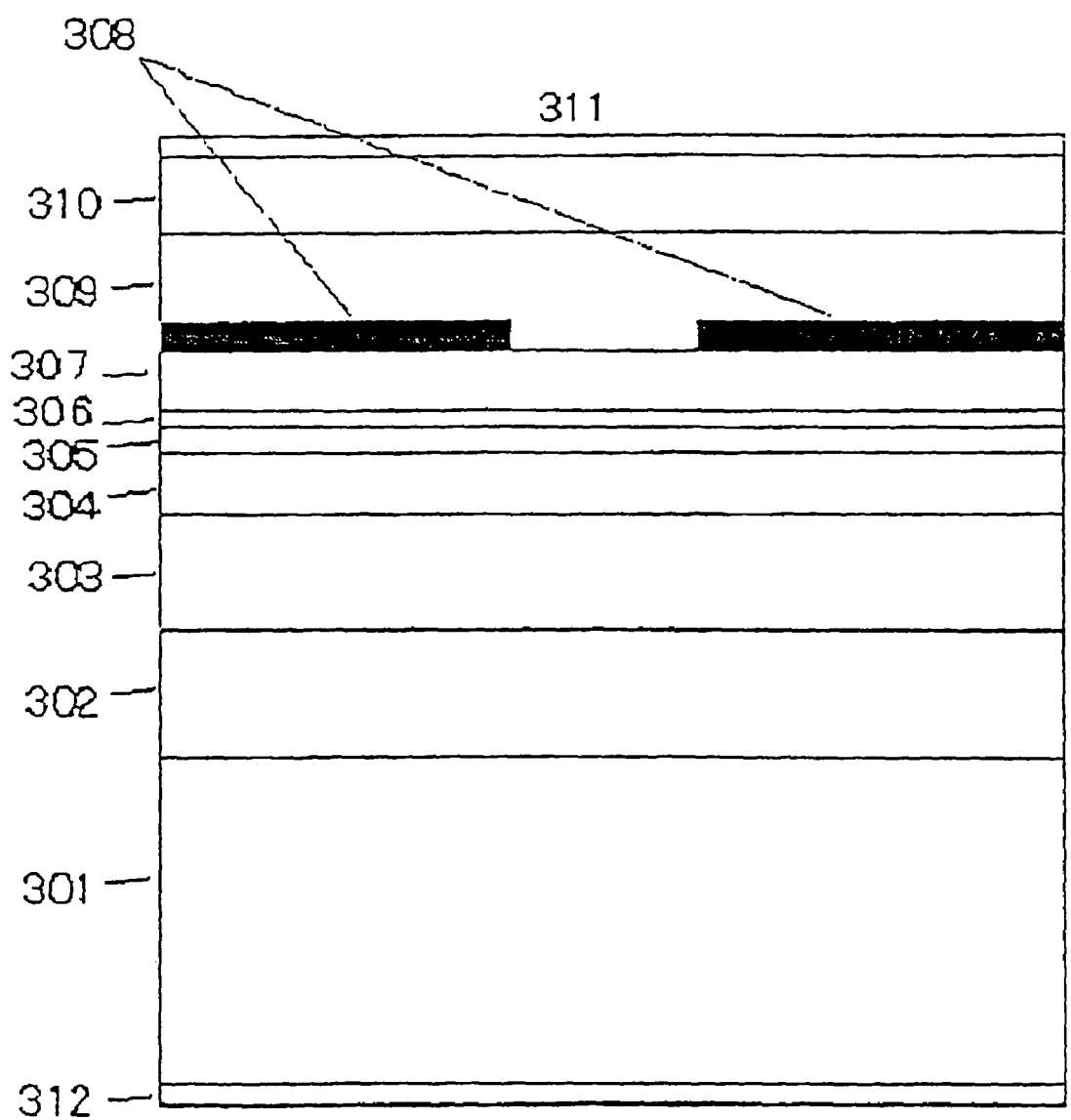
FIG. 3 is a fragmentary cross sectional elevation view of a semiconductor laser diode including a current confinement layer which is formed by a novel method of the present invention.

As described above, the present invention may advantageously be applicable to various semiconductor devices, each of which includes at least one nitride-based compound semiconductor crystal layer with at least one opening. One typical example is a semiconductor laser diode. FIG. 3 is a fragmentary cross sectional elevation view of a semiconductor laser diode including a current confinement layer which is formed by a novel method of the present invention.

A semiconductor laser diode is formed over an n-type GaN substrate 301. An Si-doped n-type GaN layer 302 is provided over the n-type GaN substrate 301. The Si-doped n-type GaN layer 302 may have a thickness of 1 micrometer, and an Si-concentration of 4E17 $cm^{-3}$. An Si-doped n-type $Al_{0.1}Ga_{0.9}N$ cladding layer 303 is provided over the Si-doped n-type GaN layer 302. The Si-doped n-type $Al_{0.1}Ga_{0.9}N$ cladding layer 303 may have a thickness of 2 micrometers, and an Si-concentration of 4E17 $cm^{-3}$. An Si-doped n-type GaN optical confinement layer 304 is provided over the Si-doped n-type $Al_{0.1}Ga_{0.9}N$ cladding layer 303. The Si-doped n-type GaN optical confinement layer 304 may have a thickness of 0.1 micrometer, and an Si-concentration of 4E17 $cm^{-3}$. A multiple quantum well layer 305 of three periods of alternating laminations of well and barrier layers is provided over the Si-doped n-type GaN optical confinement layer 304. Each of the well layers may comprise an undoped $In_{0.15}Ga_{0.85}N$ well layer which has a thickness of 3 nanometers. Each of the barrier layers may comprise an Si-doped n-type $In_{0.01}Ga_{0.99}N$ barrier layer which has a thickness of 4 nanometers and an Si-concentration of 1E18 $cm^{-3}$. An Mg-doped p-type $Al_{0.2}Ga_{0.8}N$ cap layer 306 is provided over the multiple quantum well layer 305. An Mg-doped p-type GaN guide layer 307 is provided over the Mg-doped p-type $Al_{0.2}Ga_{0.8}N$ cap layer 306. The Mg-doped p-type GaN guide layer 307 may have a thickness of 0.1 micrometer and an Mg-concentration of 2E19 $cm^{-3}$.

A current confinement layer 308 with an opening is provided over the Mg-doped p-type GaN guide layer 307. This current confinement layer 308 with an opening is formed in accordance with the novel method of the present invention. The detailed descriptions in connection with the current confinement layer 308 will be made later.

An Mg-doped p-type $Al_{0.1}Ga_{0.9}N$ cladding layer 309 is provided over the current confinement layer 308 and within the opening of the current confinement layer 308. Namely, the Mg-doped p-type $Al_{0.1}Ga_{0.9}N$ cladding layer 309 is grown over the current confinement layer 308 and an exposed surface of the Mg-doped p-type GaN guide layer 307 through the opening. The Mg-doped p-type $Al_{0.1}Ga_{0.9}N$ cladding layer 309 may have a thickness of 0.5 micrometers and an Mg-concentration of 1E19 $cm^{-3}$. An Mg-doped p-type GaN contact layer 310 is provided over the Mg-doped p-type $Al_{0.1}Ga_{0.9}N$ cladding layer 309. The Mg-doped p-type GaN contact layer 310 may have a thickness of 0.02 micrometers and an Mg-concentration of 1E20 $cm^{-3}$. A p-type electrode 311 is provided over the Mg-doped p-type GaN contact layer 310. An n-type electrode 312 is provided on a bottom surface of the substrate 301.

The above-described current confinement layer 308 is formed as follows. A Group-III nitride compound semiconductor amorphous layer is entirely formed at a low temperature and over the Mg-doped p-type GaN guide layer 307. An $SiO_2$ mask may be formed over the Group-III nitride compound semiconductor amorphous layer. Alternatively, a surface of the Group-III nitride compound semiconductor amorphous layer may be oxidized to form a thin oxide film over the Group-III nitride compound semiconductor amorphous layer. Further, alternatively, oxygen atoms may be introduced into at least an upper region of the Group-III nitride compound semiconductor amorphous layer at latest before the crystallization of the Group-III nitride compound semiconductor amorphous layer. The Group-III nitride compound semiconductor amorphous layer is then selectively and partially etched, thereby forming the above-described opening in the Group-III nitride compound semiconductor amorphous layer.

The above-described Mg-doped p-type $Al_{0.1}Ga_{0.9}N$ cladding layer 309 is then formed at a high temperature over the Group-III nitride compound semiconductor amorphous layer and over the exposed surface of the Mg-doped p-type GaN guide layer 307. The high temperature is sufficiently high for causing crystallization of the Group-III nitride compound semiconductor amorphous layer, whereby the Group-III nitride compound semiconductor amorphous layer becomes the Group-III nitride compound semiconductor crystal layer which serves as the above-described current confinement layer.

The Group-III nitride compound semiconductor amorphous layer may comprise any available Group-III nitride compound semiconductor such as amorphous AlN. The Group-III nitride compound semiconductor amorphous layer such as amorphous AlN may be formed on the p-GaN guide crystal layer 307 by any available method, for example, a metal organic vapor phase epitaxy at a low substrate temperature of at highest 600° C. Contrary to the present invention, if a single crystal AlN is formed on the p-GaN guide crystal layer 307, then a crack or cracks may be formed in the single crystal AlN layer due to a difference in lattice constant between AlN single crystal and GaN single crystal. In accordance with the present invention, if the amorphous AlN is formed on the GaN crystal layer 307 at the low substrate temperature of at highest 600° C., then the amorphous may prevent any formation of crack in the amorphous AlN.

Further, the amorphous Group-III nitride compound semiconductor such as the amorphous AlN has a much higher etching rate as compared to that of the crystal Group-III nitride compound semiconductor such as crystal GaN or crystal AlGaN. This large difference in etching rate between crystal and amorphous states provides a good or desired etching selectivity.

The preferable etching process for selectively etching the amorphous Group-III nitride compound semiconductor such as the amorphous AlN may typically be carried out by an isotropic etching such as a wet etching by use of any available etchant. One typical example of the available etchants may be a phosphate-containing etchant. In view of the possible high etching-controllability, the phosphate-containing hot etchant with a temperature in the range of 50-200° C. is preferable. And more preferably, the temperature is in the range of 80-120° C. Notwithstanding, a nitrate-containing hot etchant with a temperature of at least 80° C. is also available. The use of the phosphate-containing hot etchant may obtain an etching rate of 1-30 nm/min. of the amorphous AlN. The crystal GaN or the crystal AlGaN is not etched by those etchants. The use of any one of those etchants provides the desired or good etching selectivity.

The amorphous AlN is free of any substantive etching-rate-dependency upon the crystal orientation or the crystal plane, while the crystal state has the etching-rate-dependency. For this reason, the amorphous state allows an isotropic etching to the amorphous AlN.

The temperature increase of the amorphous AlN, for example, up to 900° C. or higher causes crystallization of the amorphous AlN with keeping a crystal orientation of the base layer. In the crystallization process, a relatively high density of dislocations is introduced into the AlN layer placed in the crystallization. This introduction of the relatively high density of dislocations so relaxes the difference in lattice-constant as to cause substantively no crack in the AlN layer. The relatively high density of dislocations of the crack-free AlN crystal layer also allows a further crack-free growth of the overlying compound semiconductor layer on the crack-free AlN crystal layer because of further propagation of the relatively high density of dislocations from the crack-free nitride-based compound semiconductor crystal layer into the overlying compound semiconductor layer, and the relatively high density of propagated dislocations in the overlying compound semiconductor layer also relaxes the difference in lattice-constant between the AlN crystal layer and the overlying compound semiconductor layer. The dislocations are originated from edge dislocations caused by a low angle grain boundary of the AlN crystal layer. The propagation of the edge dislocations is directed vertical to the plane of the growth surface. In the opening, no edge dislocation is present. For this reason, the overlying compound semiconductor layer within and over the opening has the dislocation-free crystal perfection, while the overlying compound semiconductor layer over the dislocation-introduced AlN crystal layer has also the dislocation-introduced crystal imperfection.

Consequently, the growth in the amorphous state of AlN on the crystal state GaN base layer is advantageous in view of preventing or suppressing any formation of crack in connection with the difference in lattice-constant.

Further, oxygen atoms are introduced into the AlN amorphous layer before the crystallization process thereof. In one typical example, it is available to oxidize a surface of the non-crystal layer. An introduction of oxygen into at least an upper surface region of the AlN amorphous layer is available. In another typical example, it is available to have an oxide layer present on the AlN amorphous layer at latest before the AlN amorphous layer is crystallized, so that the oxide layer on the AlN amorphous layer suppresses a mass-transport of Al atoms of the AlN amorphous layer. In one preferable example, the oxide layer may advantageously comprise an oxide mask to be used in the etching process for etching the AlN amorphous layer, prior to the crystallization process of the partially etched AlN amorphous layer with having the oxide mask remain, so that the oxide mask suppresses a mass-transport of Al atoms of the AlN amorphous layer in the crystallization process.

The intentional introduction of oxygen may provide the following two advantageous effects. The first advantageous effect is to realize a desired highly planer surface morphology. As described above, the AlN amorphous layer is partially etched, prior to the crystallization of the partially etched AlN amorphous layer. The presence of oxygen atoms over the surface region or in the upper region of the partially etched AlN amorphous layer contributes to suppress an undesired mass-transport of Al atoms of the partially etched AlN amorphous layer. The suppression to the undesired mass-transport prevents non-flatness of the surface of the crystallized AlN layer. Namely, the suppression to the undesired mass-transport realizes an island-free planarized surface of the crystallized AlN layer. The desired island-free planarized surface of the crystallized AlN layer may be transferred to the surface of the overlying crystal layer over the crystallized AlN layer, whereby a desired highly planarized surface morphology may be obtained.

The absence of oxygen atoms over the surface region or in the upper region of the partially etched AlN amorphous layer may allow an undesired mass-transport of Al atoms of the partially etched AlN amorphous layer. The allowance of the undesired mass-transport may cause non-flatness of the surface of the crystallized AlN layer. Namely, the allowance of the undesired mass-transport may result in an undesired island-like non-planarized surface of the crystallized AlN layer. The undesired island-like non-planarized surface of the crystallized AlN layer may be transferred to the surface of the overlying crystal layer over the crystallized AlN layer, whereby any undesired non-planarized surface morphology may be obtained.

The second advantageous effect is to realize a reduction in leakage of current. As described above, the crystallized AlN layer has a relatively high density of dislocations such as edge dislocations upon the crystallization process. The relatively high density of dislocations allows leak current to flow along the dislocations. However, oxygen atoms present over the surface region or in the upper region of the partially etched AlN amorphous layer are likely to be selectively localized to the dislocations in the crystallization process, whereby the dislocations become electrically inactive which reduces the leakage of current along the dislocations. This makes the AlN crystal layer suitable as current confinement layer.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 5:
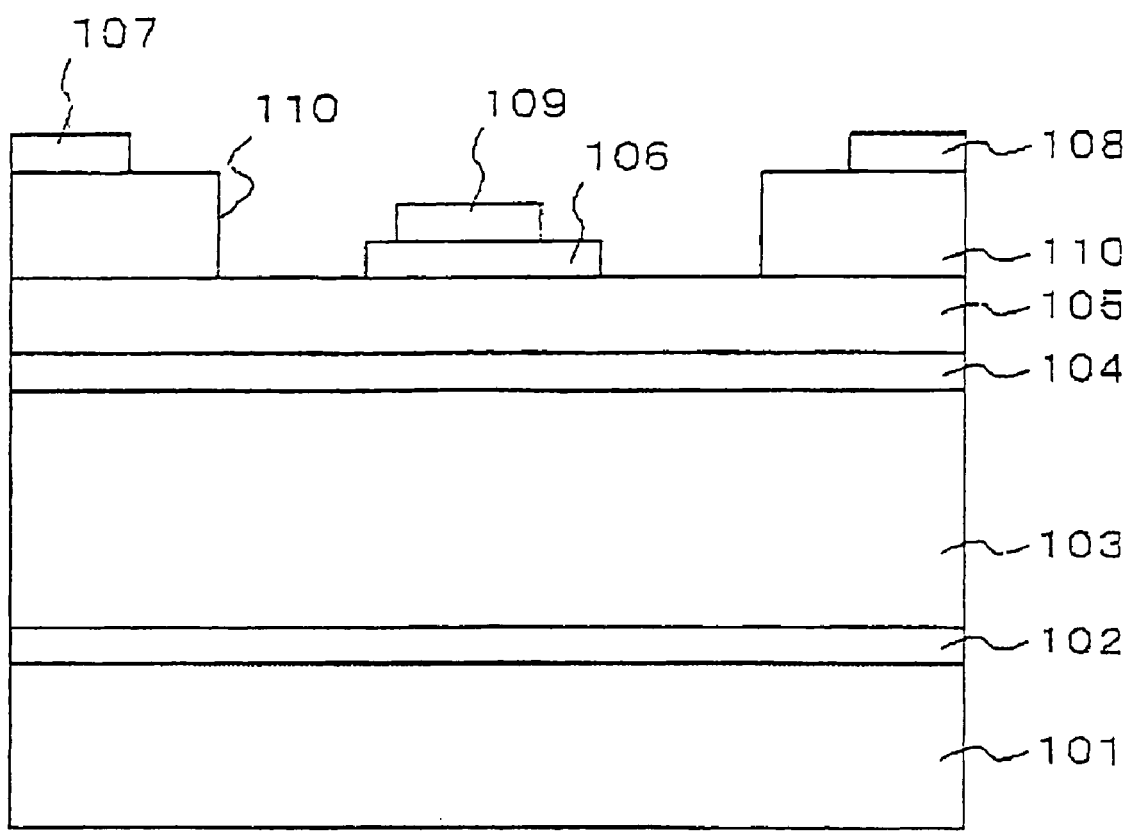
FIG. 5 is a fragmentary cross sectional elevation view of a semiconductor field effect transistor including contact layers which are formed by a novel method of the present invention.

As described above, the present invention may advantageously be applicable to various semiconductor devices, each of which includes at least one nitride-based compound semiconductor crystal layer with at least one opening. Another typical example is a semiconductor field effect transistor. FIG. 5 is a fragmentary cross sectional elevation view of a semiconductor field effect transistor including contact layers which are formed by a novel method of the present invention.

A field effect transistor is provided over a (0001)-plane or a c-face of a sapphire substrate 101. An AlN buffer layer 102 is provided over the (0001)-plane of the sapphire substrate 101. The AlN buffer layer 102 comprises an AlN layer grown at a low growth temperature. The AlN buffer layer 102 has a thickness of 20 nanometers. A GaN channel layer 103 is provided over the AlN buffer layer 102. The GaN channel layer 103 has a thickness of 1500 nanometers. An AlGaN spacer layer 104 is provided over the GaN channel layer 103. The AlGaN spacer layer 104 has a thickness of 5 nanometers. An Si-doped $Al_{0.2}Ga_{0.8}N$ carrier donor layer 105 is provided over the AlGaN spacer layer 104. The Si-doped $Al_{0.2}Ga_{0.8}N$ carrier donor layer 105 has a thickness of 20 nanometers. The Si-doped $Al_{0.2}Ga_{0.8}N$ carrier donor layer 105 has an Si-concentration of $5E18$ $cm^{-3}$. An $In_{0.05}Ga_{0.95}N$ Schottky layer 106 is selectively provided over the Si-doped $Al_{0.2}Ga_{0.8}N$ carrier donor layer 105. The $In_{0.05}Ga_{0.95}N$ Schottky layer 106 has a thickness of 10 nanometers. GaN contact layers 110 are also selectively provided over the Si-doped $Al_{0.2}Ga_{0.8}N$ carrier donor layer 105, wherein the GaN contact layers 110 are spaced apart from the $In_{0.05}Ga_{0.95}N$ Schottky layer 106. The GaN contact layers 110 have a thickness of 20 nanometers. Source and drain electrodes 107 and 108 are provided on the GaN contact layers 110. A gate electrode 109 is provided on the $In_{0.05}Ga_{0.95}N$ Schottky layer 106. The transistor has a wide recess structure, wherein the GaN contact layers 110 are spaced apart from the $In_{0.05}Ga_{0.95}N$ Schottky layer 106 under the gate electrode 109.

In accordance with the planar-structure of the conventional field effect transistor, the contact layer extends not only under the source/drain electrodes but also under the gate electrode. In order to reduce the contact resistance, it is effective to increase a carrier concentration of the contact layer. Such increase in the carrier concentration of the contact layer, however, increases the carrier concentration not only under the source/drain electrodes but also under the gate electrode. The increase in the carrier concentration under the gate electrode makes it no longer possible to obtain intended or designed characteristics of the transistor.

By contrast to the above planar-structure of the conventional field effect transistor, the wide-recess structure of the novel field effect transistor in accordance with the present invention provides the following advantages. The contact layers under the source and drain electrodes do not extend under the gate electrode. Namely, the contact layer under the gate electrode is separated from the contact layers under the source and drain electrodes, so that it is possible to decide the carrier concentration of the contact layers under the source and drain electrodes separately and independently from the carrier concentration under the gate electrode. For this reason, the flexibility or the freedom in setting the carrier concentration of the contact layers under the source and drain electrodes would be high. Such desired high flexibility in setting the carrier concentration of the contact layers under the source and drain electrodes allows a sufficient increase in the conductivity of the contact layers and also a sufficient reduction in contact resistance between the contact layers and the source and drain electrodes.

Further, the wide-recess structure provides a sufficient relaxation of a field concentration under the gate electrode. Such relaxation improves a withstand voltage characteristic of the field effect transistor.

Whereas the wide-recess structure provides the above-described advantages, it is difficult to realize the wide-recess structure because it is difficult for the prior art to realize a desired highly accurate etching to the nitride-based compound semiconductor such as GaN for forming the contact layers.

The present invention, however, establishes the certainly available technique for realizing the desired highly accurate etching to the nitride-based compound semiconductor such as GaN for forming the wide-recess structure.

The above lamination structure shown in FIG. 5 may be obtained by use of a metal organic vapor phase epitaxy. For example, the buffer layer 101 may be grown at a growth temperature typically in the range of 400-500° C., for example, 450° C. The spacer layer 104 may be grown at a growth temperature typically in the range of 1040-1100° C., for example, 1080° C. The carrier donor layer 105 may be grown at a growth temperature typically in the range of 1040-1100° C., for example, 1080° C. The Schottky layer 106 may be grown at a growth temperature typically in the range of 800-900° C., for example, 840° C. The amorphous nitride semiconductor layer for the contact layer 110 may be grown at a growth temperature typically in the range of 200-500° C., for example, 350° C. Such the low temperature growth causes the grown nitride semiconductor layer to have an amorphous structure.

In one typical example, the GaN contact layers 110 may be obtained as follows. A GaN layer is grown at a growth temperature in the range of 200-500° C., preferably in the range of 300-400° C., so that the GaN layer has an amorphous structure. The amorphous GaN layer is then subjected to a wet etching by use of any available etchant, preferably a phosphate-containing etchant, even it may be possible to optionally and advantageously mix other acid such as a sulfuric acid. The content of phosphate may preferably be in the range of 10-90 percents by volume of a total volume of the etchant. After the wet etching process, the partially or selectively etched amorphous GaN layer is then subjected to a heat treatment preferably in the range of 700-1300° C., and more preferably in the range of 900-1200° C. for causing crystallization of the partially or selectively etched amorphous GaN layer to form the crystal GaN contact layers 110.

After the crystal GaN contact layers 110 have been formed, the Schottky layer 106 is then formed. A resist film is applied on the Schottky layer 106. The resist film is then subjected to an exposure and a subsequent development to form a resist pattern over the Schottky layer 106. The Schottky layer 106 is subjected to a selective dry etching process, for example, an electron cyclotron resonance plasma etching process by use of any available gas, for example, $Cl_2$ gas to form the Schottky layer 106 in the wide-recess, wherein the Schottky layer 106 is spatially separated from the crystal GaN contact layers 110.

A first metal layered lamination structure is selectively deposited on the crystal GaN contact layers 110 in accordance with a lift-off method using an electron gun evaporation, wherein the first metal layered lamination structure comprises a Ti-layer with a thickness of 10 nanometers and an Al-layer with a thickness of 200 nanometers. The first metal layered lamination structure is then subjected to a lamp anneal at a temperature of 650° C. for 30 seconds, thereby to form the source and drain electrodes 107 and 108 over the crystal GaN contact layers 110.

Further, a resist film is applied and then subjected to an exposure and a subsequent development to form a resist pattern. A second metal layered lamination structure is selectively deposited on the Schottky layer 166 in accordance with a lift-off method using an electron gun evaporation, wherein the second metal layered lamination structure comprises a Ni-layer with a thickness of 10 nanometers and an Au-layer with a thickness of 200 nanometers, thereby to form the Schottky gate electrode 109 over the Schottky layer 106.

Consequently, the present invention realizes the above-described desired wide-recess structure of the field effect transistor, wherein the wide-recess structure includes the source and drain contact layers 110 which have the increased conductivity and the reduced contact resistance with the source and drain electrodes. The source and drain contact layers 110 are spatially separated or distanced from the Schottky gate electrode 109 and the Schottky layer 106 to provide the desired relaxation of the field concentration under the Schottky gate electrode 109.

Example 1

The following example 1 is involved in the above-described embodiment shown in FIG. 3. An n-type GaN layer with a (0001)-plane and a thickness of 250 micrometers was grown over a sapphire substrate by use of a facet-initiated epitaxial lateral overgrowth method which is disclosed by A. Usui et al. in Japan of Journal Applied Physics 36 (1997) L899. After the growth of the n-type GaN layer, the substrate was then subjected to a cooling process in which the n-type GaN layer was peeled from the sapphire substrate due to a significant difference in thermal expansion coefficient between GaN crystal and sapphire crystal, whereby the substrate was a free-standing GaN substrate with a thickness of 200 micrometers.

For forming a device structure, a low pressure metal organic vapor phase epitaxy system was used for epitaxial growth under a low pressure of 300 hPa. A mixture gas of hydrogen and nitrogen was used as a carrier gas. A trimethyl gallium gas (TMG), a trimethyl aluminum gas (TMA), and a trimethyl indium gas (TMI) were used as source gases for Ga, Al and In respectively. A silane gas ($SiH_4$) was used as an n-type dopant gas. A biscyclopentadienyl magnesium ($Cp_2Mg$) was used as a p-type dopant gas.

The "multi-layered structure growth processes" were then carried out to form an n-type cladding layer, an active layer, a p-type cladding layer and an amorphous AlN layer for a current confinement layer.

A plurality of the n-type GaN substrate 301 was placed in a growth chamber of the low pressure metal organic vapor phase epitaxy system. A substrate temperature was increased up to a growth temperature with continuing a supply of $NH_3$ into the growth chamber for starting a series of the "multi-layered structure growth processes".

An Si-doped n-type GaN layer 302 with an Si-concentration of 4E17 cm$^{-3}$ and a thickness of 1 micrometer was grown over the n-type GaN substrate 301 under conditions that a substrate temperature was 1080° C., a TMG-supplying rate was 58 micro-mol/min., and an NH$_3$-supplying rate was 0.36 mol/min.

An Si-doped n-type Al$_{0.1}$Ga$_{0.9}$N cladding layer 303 with an Si-concentration of 4E17 cm$^{-3}$ and a thickness of 2 micrometers was grown over the Si-doped n-type GaN layer 302 under conditions that a substrate temperature was 1080° C., a TMA-supplying rate was 36 micro-mol/min., a TMG-supplying rate was 58 micro-mol/min., and an NH$_3$-supplying rate was 0.36 mol/min.

An Si-doped n-type GaN optical confinement layer 304 with an Si-concentration of 4E17 cm$^{-3}$ and a thickness of 0.1 micrometer was grown over the Si-doped n-type Al$_{0.1}$Ga$_{0.9}$N cladding layer 303 under conditions that a substrate temperature was 1080° C., a TMG-supplying rate was 58 micro-mol/min., and an NH$_3$-supplying rate was 0.36 mol/min.

A multiple quantum well layer 305 of three periods of alternating laminations of well and barrier layers was grown over the Si-doped n-type GaN optical confinement layer 304. Each of the well layers comprises an undoped In$_{0.15}$Ga$_{0.85}$N well layer which has a thickness of 3 nanometers. Each of the barrier layers comprises an Si-doped n-type In$_{0.01}$Ga$_{0.99}$N barrier layer which has a thickness of 4 nanometers and an Si-concentration of 1E18 cm$^{-3}$. The each undoped In$_{0.15}$Ga$_{0.85}$N well layer was grown under conditions that a substrate temperature was 800° C., a TMG-supplying rate was 8 micro-mol/min., an NH$_3$-supplying rate was 0.36 mol/min, and a TMI-supplying rate was 48 micro-mol/min. The each Si-doped n-type In$_{0.01}$Ga$_{0.99}$N barrier layer was grown under conditions that a substrate temperature was 800° C., a TMG-supplying rate was 8 micro-mol/min., an NH$_3$-supplying rate was 0.36 mol/min, and a TMI-supplying rate was 3 micro-mol/min.

An Mg-doped p-type Al$_{0.2}$Ga$_{0.8}$N cap layer 306 was grown over the multiple quantum well layer 305 under conditions that a substrate temperature was 1080° C., a TMA-supplying rate was 36 micro-mol/min., a TMG-supplying rate was 58 micro-mol/min., and an NH$_3$-supplying rate was 0.36 mol/min. Further, an Mg-doped p-type GaN guide layer 307 with a thickness of 0.1 micrometer and an Mg-concentration of 2E19 cm$^{-3}$ was grown over the Mg-doped p-type Al$_{0.2}$Ga$_{0.8}$N cap layer 306 under conditions that a substrate temperature was 1080° C., a TMG-supplying rate was 58 micro-mol/min., and an NH$_3$-supplying rate was 0.36 mol/min.

The above-described set of the plural substrates was then subjected to a variety of substrate temperature decrease process, so that the plural substrates have various temperatures of 200° C., 300° C., 400° C., 500° C., 600° C., 700° C., and 1000° C. At those various substrate temperatures, AlN layers with a uniform thickness of 0.1 micrometer were grown over the plural substrates at a TMA-supplying rate of 36 micro-mol/min., and an NH$_3$-supplying rate was 0.36 mol/min.

Surfaces of the AlN layers over those substrates were then observed by a scanning electron microscope. Some cracks were observed over the surfaces of the AlN layers grown at the high temperatures of 600° C., 700° C., and 1000° C. Planar morphologies free of any crack were observed over the surfaces of the AlN layers grown at the low temperatures of 200° C., 300° C., 400° C. and 500° C.

Figure 4:
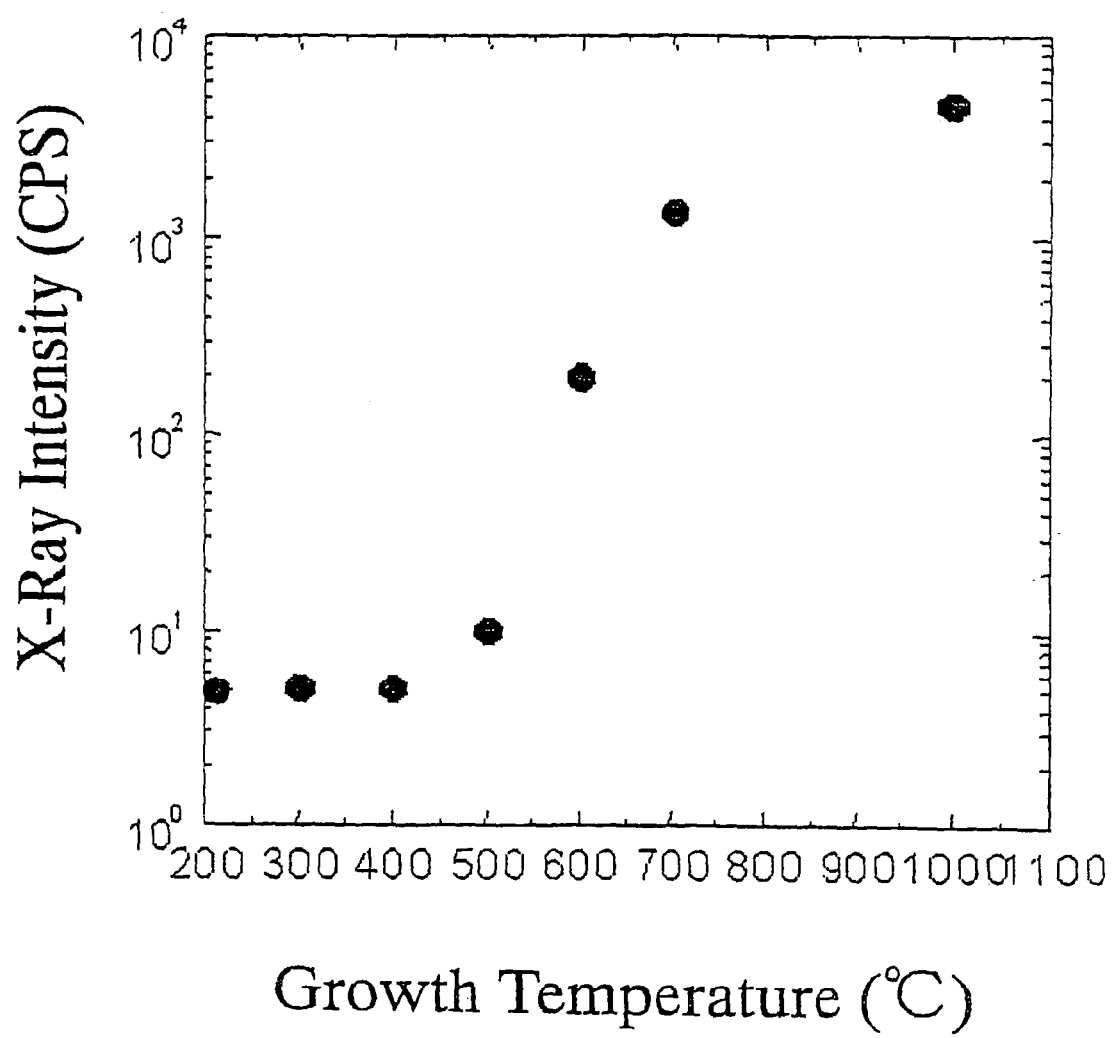
FIG. 4 is a diagram showing the result of the θ-2 θ X-ray diffraction measurement, wherein the vertical axis represents an X-ray intensity, while the horizontal axis represents a growth temperature.

Those samples were then subjected to a θ-2θ X-ray diffraction measurement. FIG. 4 is a diagram showing the result of the θ-2θ X-ray diffraction measurement, wherein the vertical axis represents an X-ray intensity, while the horizontal axis represents a growth temperature. Respective measured X-ray intensities after (0002)-diffraction were measured and plotted in FIG. 4. It was confirmed that the AlN layer grown at the temperature of 200° C. shows a (0002)-diffracted X-ray intensity of approximately 5 (cps). It was confirmed that the AlN layer grown at the temperature of 300° C. shows a (0002)-diffracted X-ray intensity of approximately 5 (cps). It was also confirmed that the AlN layer grown at the temperature of 400° C. shows a (0002)-diffracted X-ray intensity of approximately 5 (cps). It was also confirmed that the AlN layer grown at the temperature of 500° C. shows a (0002)-diffracted X-ray intensity of approximately 10 (cps). It was also confirmed that the AlN layer grown at the temperature of 600° C. shows a (0002)-diffracted X-ray intensity of approximately 200 (cps). It was also confirmed that the AlN layer grown at the temperature of 700° C. shows a (0002)-diffracted X-ray intensity of over 1000 (cps). It was also confirmed that the AlN layer grown at the temperature of 1000° C. shows a (0002)-diffracted X-ray intensity of over 4000 (cps). The (0002)-diffracted X-ray intensities of the AlN layers grown in the low temperature range of 200-500° C. are lower than 1/100 of the (0002)-diffracted X-ray intensity of the AlN layer grown at the high temperature of 1000° C. The above results demonstrate that of the AlN layers grown in the low temperature range of 200-500° C. are in the amorphous phase. The increase in the growth temperature from 600° C. causes the increase in the crystal phase of the AlN layer. The increase in the crystal phase of the AlN layer causes an undesired increase in the strain of the lattice structure of the AlN layer due to a significant difference in lattice constant between AlN crystal and GaN crystal. The increased strain of the lattice structure of the AlN layer causes some cracks. Accordingly, it was confirmed that the preferable growth temperature for growing the crack-free AlN layer in amorphous phase would be in the range of 200-500° C.

Subsequent to the above "multi-layered structure growth processes", a "stripe-shaped opening formation process" for forming a stripe-shaped opening in the amorphous AlN layer was then carried out but only for the samples including the amorphous AlN layers grown at the low temperatures of 200° C., 300° C., 400° C. and 500° C. An SiO$_2$ film with a thickness of 100 nanometers was deposited on the amorphous AlN layer of each of those samples. A resist was then applied on the SiO$_2$ film. A lithography process was carried out to form a resist pattern over the SiO$_2$ film. The resist pattern has a stripe-shaped opening with a width of 2 micrometers. The SiO$_2$ film was then subjected to a selective wet etching by use of a buffered fluorine acid solution as an etchant and the resist pattern as a mask. The used resist pattern was then removed by an organic solvent from the surface of the selectively etched SiO$_2$ film, followed by a water-cleaning process. The amorphous AlN layer was free from any damage or any etching during the above processes using the buffered fluorine acid solution, the organic solvent as well as the water-cleaning process. The amorphous AlN layer was then subjected to a selective wet etching by use of the selectively etched SiO$_2$ film as a mask and a hot etchant of 80° C. which comprises a mixture solution having a 1:1 volume ratio of phosphate and sulfate. A part of the amorphous AlN layer was exposed through the stripe-shaped opening of the selectively etched SiO$_2$ film to the hot etchant for 10 minutes, whereby a stripe-shaped opening with a width of 2 micrometers was formed in the amorphous AlN layer. In the wet-etching process, the crystal GaN layer underlying the amorphous AlN layer served as an etching stopper. The used selectively etched SiO$_2$ film was then removed. As a result, the amorphous AlN layer having the desired finely-defined stripe-shaped opening was obtained.

For comparison, the above-described "stripe-shaped opening formation process" for forming the stripe-shaped opening in the AlN layer was further carried out for the other samples including the crack-containing AlN layers grown at the high temperatures of 600° C. and 700° C. The mixture etchant containing phosphate and sulfate not only was made into contact with the exposed surface of the crack-containing AlN layer through the stripe-shaped opening of the selectively etched $SiO_2$ film but also was impregnated through the cracks into the unexposed parts of the crack-containing AlN layer covered by the selectively etched $SiO_2$ film as a mask. As a result, the AlN layer having the undesired roughly-defined stripe-shaped opening was obtained.

Accordingly, it was confirmed that the preferable growth temperature for allowing the desired finely-defined stripe-shaped opening in the crack-free AlN layer in amorphous phase would be in the range of 200-500° C.

As described above, the 80° C.-hot etchant including the mixture of phosphate and sulfate was used. Sulfate was mixed to adjust an etching rate. The selectively etched $SiO_2$ film as a mask and the GaN layer underlying the crack-free amorphous AlN layer were not etched by the etchant. A desired etching selectivity was thus demonstrated.

For comparison, it was confirmed that if the temperature of the etchant is lower than 50° C., then any useful etching rate of the AlN layer is not obtained. It was also confirmed that if the temperature of the etchant is higher than 200° C., then the GaN layer underlying the crack-free amorphous AlN layer may be etched. It was, therefore, confirmed that the preferably temperature of the etchant is in the range of 50-200° C.

Although, in the above typical example, the $SiO_2$ etching mask was used for the selective wet etching process, $SiN_x$ or organic materials including resist materials are available, provided that the mask material is not etched by the etchant.

Subsequent to the above-described "stripe-shaped opening formation process", the "multi-layered structure re-growth processes" were then carried out for growing a p-type AlGaN cladding layer over the amorphous AlN layer and within the stripe-shaped opening of the amorphous AlN layer and further a p-type GaN contact layer over the p-type AlGaN cladding layer. The substrates were again placed in the growth chamber of the metal organic vapor phase epitaxy system. A substrate temperature was increased up to a growth temperature of 1100° C. with continuing a supply of $NH_3$ into the growth chamber at an $NH_3$-supplying rate of 0.36 mol/min. for starting a series of the "multi-layered structure re-growth processes".

An Mg-doped p-type $Al_{0.1}Ga_{0.9}N$ cladding layer 309 with an Mg-concentration of $1E19$ cm$^{-3}$ and a thickness of 0.5 micrometers was grown over the amorphous AlN layer 308 and within the stripe-shaped opening of the amorphous AlN layer 308 under conditions that a substrate temperature was 1100° C., a TMA-supplying rate was 36 micro-mol/min., a TMG-supplying rate was 58 micro-mol/min., and an $NH_3$-supplying rate was 0.36 mol/min.

After the substrate temperature was decreased from 1100° C. to 1080° C., then an Mg-doped p-type GaN contact layer 310 with an Mg-concentration of $1E20$ cm$^{-3}$ and a thickness of 0.02 micrometers was grown over the Mg-doped p-type $Al_{0.1}Ga_{0.9}N$ cladding layer 309 under conditions that a substrate temperature was 1080° C., a TMG-supplying rate was 58 micro-mol/min., and an $NH_3$-supplying rate was 0.36 mol/min.

Surfaces of the GaN contact layers over those substrates were then observed by the scanning electron microscope. It was confirmed that the surfaces of the GaN contact layers over those substrates are free of any cracks or defects such as pits. It was also confirmed that the above AlN layer having the stripe-shaped opening was buried by the laminations of the Mg-doped p-type $Al_{0.1}Ga_{0.9}N$ cladding layer 309 and the Mg-doped p-type GaN contact layer 310. It was also observed that the Mg-doped p-type GaN contact layer 310 has a generally planarized surface, for which a slightly wavy like morphology was observed.

Further, cross sections of the samples near the stripe-shaped openings of the AlN layers 308 were observed by a transmission electron microscope. It was confirmed that the AlN layer 308 has a high density of through dislocation in the range of $5E10$ cm$^{-2}$ to $1E12$ cm$^{-2}$. It was also confirmed that the Mg-doped p-type AlGaN cladding layer 309 overlying the AlN layer 308 has substantially the same high density of through dislocation in the range of $5E10$ cm$^{-2}$ to $1E12$ cm$^{-2}$, except over the stripe-shaped opening of the AlN layer 308. Namely, it was confirmed that the Mg-doped p-type AlGaN cladding layer 309 over the stripe-shaped opening of the AlN layer 308 is free of dislocations. It was further confirmed that the through dislocations propagate in a vertical direction to the surface of the substrate, but only upwardly from the AlN layer 308. No downward propagations of the through dislocations from the AlN layer 308 were observed. As a result of the above observations, it was demonstrated that the high density dislocations introduced into the AlN layer relax the lattice strain of the AlN layer, whereby the crack-free re-growth over the AlN layer was realized. As a result of the above processes, the wafer for laser diode was obtained.

Subsequently, the "electrode formation processes" were then carried out for forming a p-electrode and an n-electrode on the obtained laser diode wafer. A Ti-layer with a thickness of 5 nanometers was deposited on a bottom surface of the n-type GaN substrate 301 by a vacuum evaporation. Subsequently, an Al-layer with a thickness of 20 nanometers was deposited on the Ti-layer by the vacuum evaporation. Further, an Ni-layer with a thickness of 10 nanometers was deposited on the Mg-doped p-type GaN contact layer 310 by the vacuum evaporation. Subsequently, an Al-layer with a thickness of 10 nanometers was deposited on the Ni-layer by the vacuum evaporation.

The sample wafers were then loaded into a rapid thermal anneal system for subjecting the sample wafers to a rapid thermal anneal at a temperature of 600° C. for 30 seconds for alloying the Ti-layer and the Al-layer, thereby to form an ohmic contact of Ti—Al alloy and also for alloying the Ni-layer and the Al-layer, thereby to form another ohmic contact of Ni—Al alloy. Further, an Au-layer with a thickness of 500 nanometers was deposited by the vacuum evaporation on the Ti—Al alloy ohmic contact to form the n-electrode 312 on the bottom surface of the substrate 301. Furthermore, another Au-layer with a thickness of 500 nanometers was also deposited by the vacuum evaporation on the Ni—Al alloy ohmic contact to form the p-electrode 311 on the Mg-doped p-type GaN contact layer 310.

The laser diode wafers were cleaved in planes vertical to the longitudinal direction of the stripe-shaped opening to form uncoated laser diode chips which have a typical cavity length of 500 micrometers.

The obtained uncoated laser diode chips were then fusion-spliced to heat sinks for investigations on light-emitting characteristics. A laser emission was caused at an injection current density of 2.8 kA/cm$^2$ and a driving voltage of 4.7V. Further, far-field patterns at 20 mW output of the laser diode chips were investigated. It was confirmed that the far-field patterns in both the vertical and horizontal directions have single peaks which demonstrate that good transverse mode controls were realized. It was further confirmed that a radiation angle in the horizontal direction is 12 degrees, while another radiation angle in the vertical direction is 23 degrees. These results in connection with the radiation angles are almost matched to the simulation result obtained by assuming that the stripe-width is 2 micrometers. Those demonstrate that the AlN layer effectively serves as a current confinement layer which realizes a highly efficient carrier injection.

Cross sections of the remainders of the above-obtained laser diode wafers were observed by the transmission electron microscope. It was confirmed that the AlN layer has a single crystal structure. This demonstrates that the amorphous phase of the AlN layer was converted into the single crystal phase upon the heat treatment carried out for forming the overlaying crystal layers over the AlN layer.

In this first example, the amorphous AlN layer was grown on the optical guide layer. The present invention is, however, to utilize the difference in property of material between the nitride-based compound semiconductor amorphous such as amorphous AlN, amorphous GaN or amorphous InN and the nitride-based compound semiconductor crystal such as crystal GaN or crystal AlGaN. It may, therefore, be possible that the amorphous AlN layer is grown in or on the p-type cladding layer.

The AlN layer serves as the current confinement layer, for which reason the AlN layer has an insulativity. It is, however, possible as a modification that the compound semiconductor of the current confinement layer may include any additional element or elements such as Ga, In and B in addition to Al and N, provided that the current confinement layer may have a sufficient insulativity for allowing the current confinement layer to show the desired performance.

It is also possible as a further modification that the current confinement layer may comprise alternating laminations of AlN layer and GaN or InN layer.

Example 2

The "multi-layered structure growth processes" were carried out in the same manners as in Example 1 to form the lamination structure of the above n-type GaN buffer layer, the above n-type AlGaN cladding layer, the above n-type GaN guide layer, and the above InGaN multiple quantum well active layer, the above p-type GaN guide layer and the amorphous AlN layer for a current confinement layer. The growth of the amorphous AlN layer was carried out at the substrate temperature of 400° C. The wafer was then loaded into a normal pressure anneal reactor, and 1 SLM of oxygen and 4 SLM of nitrogen were supplied for causing a surface oxidation of the wafer at 400° C. for 20 minutes.

Subsequently, the "stripe-shaped opening formation process" was then carried out in the same manner as in Example 1 for forming the above stripe-shaped opening in the amorphous AlN layer.

Subsequently, the "multi-layered structure re-growth processes" were then carried out in the same manner as in Example 1 for growing the above p-type AlGaN cladding layer over the surface-oxidized amorphous AlN layer and within the stripe-shaped opening of the amorphous AlN layer and further the above p-type GaN contact layer over the p-type AlGaN cladding layer.

Subsequently, the "electrode formation processes" were then carried out in the same manner as in Example 1 for forming the above p-electrode and the above n-electrode on the obtained laser diode wafer.

The obtained laser diode wafer has the finely-shaped opening through the preferred selective etching. This laser diode wafer will, hereinafter, be referred to as an "Sample-A". The "Sample-A" was the same as the preferred laser diode wafers in Example 1, except that the surface of the amorphous AlN layer was oxidized before the wet etching process was carried out for forming the stripe-shaped opening in the surface-oxidized amorphous AlN layer.

For comparison, another laser diode wafer was formed, wherein the amorphous AlN layer was covered by an undoped GaN cap layer instead of the oxidized surface of the amorphous AlN layer.

The "multi-layered structure growth processes" were carried out in the same manners as in Example 1 to form the lamination structure of the above n-type GaN buffer layer, the above n-type AlGaN cladding layer, the above n-type GaN guide layer, and the above InGaN multiple quantum well active layer, the above p-type GaN guide layer and the amorphous AlN layer for a current confinement layer. The growth of the amorphous AlN layer was carried out at the substrate temperature of 400° C. Subsequently, an undoped GaN cap layer with a thickness of 0.1 micrometers was further grown on the amorphous AlN layer at a substrate temperature of 400° C. During the growth process for the undoped GaN cap layer, TMG and $NH_3$ were supplied at supplying rates of 7 micro-mol/min. and 0.36 mol/min, respectively.

Subsequently, the "stripe-shaped opening formation process" was then carried out in the same manner as in Example 1 for forming the above stripe-shaped opening in the amorphous AlN layer and in the undoped GaN cap layer overlying the amorphous AlN layer.

Subsequently, the "multi-layered structure re-growth processes" were then carried out in the same manner as in Example 1 for growing the above p-type AlGaN cladding layer over the undoped GaN cap layer overlying the amorphous AlN layer and within the stripe-shaped opening and further growing the above p-type GaN contact layer over the p-type AlGaN cladding layer.

Subsequently, the "electrode formation processes" were then carried out in the same manner as in Example 1 for forming the above p-electrode and the above n-electrode on the obtained laser diode wafer.

The obtained laser diode wafer has the finely-shaped opening through the preferred selective etching. This laser diode wafer will, hereinafter, be referred to as an "Sample-B". The "Sample-B" was the same as the preferred laser diode wafers in Example 1, except that the surface of the amorphous AlN layer was covered by the undoped GaN cap layer before the wet etching process was carried out for forming the stripe-shaped opening in the surface-oxidized amorphous AlN layer.

For further comparison, still another laser diode wafer was formed, wherein the amorphous AlN layer was not oxidized nor covered by an undoped GaN cap layer. Namely, the laser diode wafer was identically the same as the wafer in Example 1, wherein the AlN amorphous layer was grown at the temperature of 400° C.

Accordingly, the "multi-layered structure growth processes" were carried out in the same manners as in Example 1 to form the lamination structure of the above n-type GaN buffer layer, the above n-type AlGaN cladding layer, the above n-type GaN guide layer, and the above InGaN multiple quantum well active layer, the above p-type GaN guide layer and the amorphous AlN layer for a current confinement layer.

The growth of the amorphous AlN layer was carried out at the substrate temperature of 400° C.

Subsequently, the "stripe-shaped opening formation process" was then carried out in the same manner as in Example 1 for forming the above stripe-shaped opening in the amorphous AlN layer.

Subsequently, the "multi-layered structure re-growth processes" were then carried out in the same manner as in Example 1 for growing the above p-type AlGaN cladding layer over the amorphous AlN layer and within the stripe-shaped opening and further growing the above p-type GaN contact layer over the p-type AlGaN cladding layer.

Subsequently, the "electrode formation processes" were then carried out in the same manner as in Example 1 for forming the above p-electrode and the above n-electrode on the obtained laser diode wafer.

The obtained laser diode wafer has the finely-shaped opening through the preferred selective etching. This laser diode wafer will, hereinafter, be referred to as an "Sample-C". The "Sample-C" was the same as the preferred laser diode wafers in Example 1, provided that the amorphous AlN layer was grown at the temperature of 400° C.

The respective samples "Sample-A", "Sample-B" and "Sample-C" were then subjected to an SIMS-measurement. It was confirmed that the "Sample-A" and the "Sample-C" are higher in oxygen concentration of the AlN layer, and for example, the "Sample-A" has an oxygen concentration peak of $4E19$ $cm^{-3}$, and the "Sample-C" has an oxygen concentration peak of $8E18$ $cm^{-3}$. It was also confirmed that the "Sample-B" has an oxygen concentration peak of $2E17$ $cm^{-3}$ on the interface between the AlN layer and the undoped GaN cap layer.

Although the series of the above processes for forming the "Sample-C" does not include any oxidation process, the AlN layer of the "Sample-C" has the relatively high oxygen concentration peak. This demonstrates that oxygen was introduced into the AlN layer or the surface of the AlN layer was oxidized during the process for forming the $SiO_2$ film as the mask over the AlN layer for the selective wet etching process.

As described above, the AlN layer of the "Sample-B" has the lower oxygen concentration peak as compared to that of the "Sample-C", even both the processes for the "Sample-B" and the "Sample-C" do not include any oxidation process. This demonstrates that oxygen was introduced into the undoped GaN cap layer overlying the AlN layer or the surface of the undoped GaN cap layer was oxidized during the process for forming the $SiO_2$ film as the mask over the undoped GaN cap layer for the selective wet etching process for selectively etching the AlN layer underlying the undoped GaN cap layer. Further, it is demonstrated that the surface-oxidized undoped GaN cap layer was evaporated, so that the clean surface of the AlN layer appeared.

The surface morphology of the obtained wafers was observed. For the "Sample-C", a wavy like morphology over the AlN layer was observed. For the "Sample-A", an extremely plane surface was observed. For the "Sample-B", a rough surface including pit-like defects was observed. As described above, the "Sample-A" has the highest oxygen concentration on the top interface of the AlN layer. The "Sample-C" has the next higher oxygen concentration on the top interface of the AlN layer. The "Sample-B" has the lowest oxygen concentration on the top interface of the AlN layer. The above results of the observation of the surface morphology demonstrate that for improvement in the surface planarity, it is effective that the oxygen concentration on the top interface of the AlN layer is high. The presence of oxygen on the top interface or the top surface of the AlN layer would effectively contribute to suppress any mass transport of Al atoms in the crystallization process of the amorphous AlN layer. The effective suppression to the mass transport would suppress the surface from being rough.

Further, the above laser diode chips "Sample-A", "Sample-B" and "Sample-C" was subjected to the following additional investigation on leakage of current. A square-shaped region of 200 micrometers by 200 micrometers free of the stripe-shaped opening region was cut from each of the above laser diode chips "Sample-A", "Sample-B" and "Sample-C". The respective square-shaped cut regions from "Sample-A", "Sample-B" and "Sample-C" were measured in the leakage of current. It was confirmed that the square-shaped cut region from "Sample-B" shows a leak current of 2.1 mA upon applying a voltage of +5V to the p-type electrode. It was, however, confirmed that the square-shaped cut region from "Sample-A" shows a much lower leak current of 1.0 micro-A even upon applying a high voltage of +30V to the p-type electrode. It was also confirmed that the square-shaped cut region from "Sample-C" shows a much lower leak current of 3.0 micro-A even upon applying the high voltage of +30V to the p-type electrode. The above results of the measurement of the leakage of current demonstrate that for suppression of the leakage of current, it is effective that the oxygen concentration on the top interface of the AlN layer is high. The presence of oxygen on the top interface or the top surface of the AlN layer would effectively contribute to suppress any leakage of current through the top surface of the AlN layer.

In this second example, the amorphous AlN layer was grown on the optical guide layer. The present invention is, however, to utilize the difference in property of material between the nitride-based compound semiconductor amorphous such as amorphous AlN, amorphous GaN or amorphous InN and the nitride-based compound semiconductor crystal such as crystal GaN or crystal AlGaN. It may, therefore, be possible that the amorphous AlN layer is grown in or on the p-type cladding layer.

The AlN layer serves as the current confinement layer, for which reason the AlN layer has an insulativity. It is, however, possible as a modification that the compound semiconductor of the current confinement layer may include any additional element or elements such as Ga, In and B in addition to Al and N, provided that the current confinement layer may have a sufficient insulativity for allowing the current confinement layer to show the desired performance.

It is also possible as a further modification that the current confinement layer may comprise alternating laminations of AlN layer and GaN or InN layer.

In the second embodiment, the oxidation process for the AlN layer may be carried out by either an anneal in an oxygen containing atmosphere or deposition of an $SiO_2$ film. It is also available as a modification to expose the surface of the amorphous AlN layer to an atmosphere or an air.

Example 3

An amorphous GaN layer was grown on a single crystal GaN layer at a temperature of 350° C. before the amorphous GaN layer was then subjected to a selective wet etching, by use of the single crystal GaN layer as an etching stopper and of a hot etchant of 95° C. which contains phosphate and sulfate at 1:1 ratio. The etching rate was that etching by 0.1 micrometer depth takes a time in the range of 20-40 minutes. The wet etching process was terminated when the surface of the single crystal GaN layer underlying the amorphous GaN layer, whereby a "Sample-D" was obtained.

Similarly, another amorphous GaN layer was grown on another single crystal GaN layer at a different temperature of 400° C. before the amorphous GaN layer was then subjected to a selective wet etching, by use of the single crystal GaN layer as an etching stopper and of the same hot etchant of 95° C. which contains phosphate and sulfate at 1:1 ratio. The etching rate was that etching by 0.1 micrometer depth takes a time in the range of 20-40 minutes. The wet etching process was terminated when the surface of the single crystal GaN layer underlying the amorphous GaN layer, whereby a "Sample-E" was obtained.

Similarly, still another amorphous GaN layer was grown on still another single crystal GaN layer at a different temperature of 450° C. before the amorphous GaN layer was then subjected to a selective wet etching, by use of the single crystal GaN layer as an etching stopper and of the same hot etchant of 95° C. which contains phosphate and sulfate at 1:1 ratio. The etching rate was extremely slow as compared to "Sample-D" and "Sample-E". The wet etching process was terminated when the surface of the single crystal GaN layer underlying the amorphous GaN layer, whereby a "Sample-F" was obtained.

The obtained "Sample-D" and "Sample-E" were then subjected to a heat treatment at a temperature of 1100° C. The heat-treated "Sample-D" and "Sample-E" were observed by a transmission electron microscope. It was confirmed that for each of the heat-treated "Sample-D" and "Sample-E", the amorphous phase of the overlying GaN layer was converted into the single crystal phase.

Accordingly, this example demonstrated that it is possible to selectively etch the undoped amorphous GaN layer over the crystal GaN etching stopper layer underlying the amorphous GaN layer.

In addition, any influence of doping into the amorphous GaN layer was investigated. An amorphous Si-doped GaN layer having an Si-concentration of about 1E19 cm$^{-3}$ was grown on a single crystal GaN layer at a temperature of 350° C. before the amorphous Si-doped GaN layer was then subjected to a selective wet etching, by use of the single crystal GaN layer as an etching stopper and of a hot etchant of 95° C. which contains phosphate and sulfate at 1:1 ratio. The etching rate was that etching by 0.1 micrometer depth takes a time in the range of 20-40 minutes. The wet etching process was terminated when the surface of the single crystal GaN layer underlying the amorphous Si-doped GaN layer, whereby a "Sample-G" was obtained.

Similarly, another amorphous Si-doped GaN layer having an Si-concentration of about 1E19 cm$^{-3}$ was grown on another single crystal GaN layer at a different temperature of 400° C. before the amorphous Si-doped GaN layer was then subjected to a selective wet etching, by use of the single crystal GaN layer as an etching stopper and of the same hot etchant of 95° C. which contains phosphate and sulfate at 1:1 ratio. The etching rate was that etching by 0.1 micrometer depth takes a time in the range of 20-40 minutes. The wet etching process was terminated when the surface of the single crystal GaN layer underlying the amorphous Si-doped GaN layer, whereby a "Sample-H" was obtained.

Similarly, still another Si-doped amorphous GaN layer having an Si-concentration of about 1E19 cm$^{-3}$ was grown on still another single crystal GaN layer at a different temperature of 450° C. before the amorphous Si-doped GaN layer was then subjected to a selective wet etching, by use of the single crystal GaN layer as an etching stopper and of the same hot etchant of 95° C. which contains phosphate and sulfate at 1:1 ratio. The etching rate was extremely slow as compared to "Sample-G" and "Sample-H". The wet etching process was terminated when the surface of the single crystal GaN layer underlying the amorphous Si-doped GaN layer, whereby a "Sample-I" was obtained.

The obtained "Sample-G" and "Sample-H" were then subjected to a heat treatment at a temperature of 1100° C. The heat-treated "Sample-G" and "Sample-H" were observed by a transmission electron microscope. It was confirmed that for each of the heat-treated "Sample-G" and "Sample-H", the amorphous phase of the overlying Si-doped GaN layer was converted into the single crystal phase.

Accordingly, this investigation demonstrated that it is possible to selectively etch the highly doped amorphous GaN layer over the crystal GaN etching stopper layer underlying the amorphous GaN layer.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A Group III nitride semiconductor laser diode on a Group III nitride semiconductor substrate, comprising:
   an InGaN-well based light-emitting layer;
   a Mg-doped p-type GaN guide layer;
   an AlN-based oxygen-containing current confinement layer overlying and in direct contact with an uppermost surface of said guide layer and comprising an opening; and
   a Mg-doped p-type AlGaN cladding layer formed on said guide layer and said current confinement layer so as to bury the opening,
   wherein said current confinement layer has a peak oxygen concentration of more than $8 \times 10^{18}/cm^3$,
   wherein said current confinement layer and a region of said cladding layer that overlies the current confinement layer have a dislocation density of at least $1 \times 10^{10}/cm^2$,
   wherein said current confinement layer and said region of said cladding layer that overlies the current confinement layer have a higher density of dislocations than the density of dislocations of a region of said guide layer and a region of the cladding layer that overlies the opening; and
   wherein an Al composition of said current confinement layer is higher than an Al composition of said guide layer and said cladding layer.

2. A Group III nitride semiconductor laser diode on a Group III nitride semiconductor substrate, comprising:
   an InGaN-well based light-emitting layer;
   a Mg-doped p-type GaN guide layer;
   an AlN-based oxygen-containing current confinement layer overlying and in direct contact with an uppermost surface of said guide layer and comprising an opening; and
   a Mg-doped p-type AlGaN cladding layer formed on said guide layer and said current confinement layer so as to bury the opening,
   wherein an interface between said current confinement layer and cladding layer has a peak oxygen concentration of more than $8 \times 10^{18}/cm^3$,
   wherein said current confinement layer and a region of said cladding layer that overlies said current confinement layer have a dislocation density of at least $1 \times 10^{10}$ cm$^{-2}$, wherein said current confinement layer and said region of said cladding layer that overlies the current confinement layer have a higher density of dislocations than the density of dislocations of said guide layer and a region of the cladding layer that overlies the opening; and wherein an Al composition of said current confinement layer is higher than an Al composition of said guide layer and said cladding layer.

* * * * *